United States Patent
Bodvarsson et al.

(10) Patent No.: US 11,943,589 B2
(45) Date of Patent: *Mar. 26, 2024

(54) SHIELDED HEARING DEVICE COMPONENTS AND RELATED METHODS

(71) Applicant: GN Hearing A/S, Ballerup (DK)

(72) Inventors: Thorvaldur Oli Bodvarsson, Ballerup (DK); Kamila Piotrowska, Ballerup (DK); Prasong Thongkhan, Ballerup (DK)

(73) Assignee: GN HEARING A/S, Ballerup (DK)

( * ) Notice: Subject to any disclaimer, the term of this patent is extended or adjusted under 35 U.S.C. 154(b) by 0 days.

This patent is subject to a terminal disclaimer.

(21) Appl. No.: 17/498,519

(22) Filed: Oct. 11, 2021

(65) Prior Publication Data

US 2022/0132257 A1    Apr. 28, 2022

(30) Foreign Application Priority Data

Oct. 23, 2020 (DK) .............................. PA202070701

(51) Int. Cl.
*H04R 25/00* (2006.01)
*H05K 3/28* (2006.01)
*H05K 9/00* (2006.01)

(52) U.S. Cl.
CPC ........... *H04R 25/609* (2019.05); *H04R 25/65* (2013.01); *H05K 3/284* (2013.01); *H05K 9/0024* (2013.01); *H05K 2203/1322* (2013.01)

(58) Field of Classification Search
CPC ............................ H04R 2225/49; H04R 25/00
USPC ................................................. 381/189, 312
See application file for complete search history.

(56) References Cited

U.S. PATENT DOCUMENTS

| | | | | |
|---|---|---|---|---|
| 4,368,281 A | * | 1/1983 | Brummett | H05K 1/095 174/257 |
| 7,003,127 B1 | * | 2/2006 | Sjursen | H04R 25/65 381/328 |
| 7,109,817 B2 | | 9/2006 | Kolb et al. | |
| 8,004,860 B2 | | 8/2011 | Salzman | |
| 2011/0254523 A1 | * | 10/2011 | Ito | G05F 1/00 323/282 |
| 2016/0262292 A1 | | 9/2016 | Kuk et al. | |
| 2017/0181268 A1 | | 6/2017 | Chiu et al. | |

FOREIGN PATENT DOCUMENTS

| | | |
|---|---|---|
| SG | 189571 | 5/2013 |
| WO | WO 2021/078541 | 4/2021 |

OTHER PUBLICATIONS

Foreign Search Report for Danish Patent Appln. No. PA 2020 70701 dated Jan. 22, 2021.
Extended European Search Report for EP Patent Appln. No. 21201393.2 dated Mar. 18, 2022.

* cited by examiner

*Primary Examiner* — George C Monikang
(74) *Attorney, Agent, or Firm* — Vista IP Law Group, LLP

(57) ABSTRACT

Audio device, electronic circuit, and related methods, in particular a method of manufacturing an electronic circuit for an audio device is disclosed, the method comprising providing a circuit board; mounting one or more electronic components including a first electronic component on the circuit board; applying a first insulation layer outside the first electronic component; and applying a first shielding layer outside the first insulation layer.

28 Claims, 13 Drawing Sheets

SHIELDED HEARING DEVICE COMPONENTS AND RELATED METHODS

RELATED APPLICATION DATA

This application claims priority to, and the benefit of, Danish Patent Application No. PA 202070701 filed on Oct. 23, 2020. The entire disclosure of the above application is expressly incorporated by reference herein.

FIELD

The present disclosure relates to an audio device, an electronic circuit, and related methods, in particular a method of manufacturing an electronic circuit of an audio device.

BACKGROUND

Audio devices comprising electronic circuits with electronic components may often be exposed to electromagnetic fields disturbing the operation of electronic components of the electronic circuit. It is therefore desirable to shield the electronic components of the electronic circuits from these electromagnetic fields. Today the shielding of electronic devices in audio devices is performed with shielding cans such as with folded sheets of metal or encapsulations. These shielding cans need clearance to the electronic components, which results in voluminous and cumbersome shielding in the audio devices. Today's encapsulations do often not provide optimal encapsulation of electronic components.

SUMMARY

Accordingly, there is a need for audio devices and methods of manufacturing audio devices with improved insulation, encapsulation, and/or shielding.

A method of manufacturing an electronic circuit of an audio device is disclosed, the method comprises providing a body comprising a circuit board and one or more components including a first component mounted on the circuit board; applying a first insulation layer; applying a second insulation layer; and applying one or more shielding layers including a first shielding layer covering at least a part of the second insulation layer, wherein applying the first insulation layer comprises jetting the first insulation layer and curing the first insulation layer, and applying the second insulation layer comprises jetting the second insulation layer and curing the second insulation layer.

Further, an audio device is disclosed, the audio device comprising a housing and an electronic circuit accommodated in the housing, the electronic circuit comprising a circuit board and one or more electronic components including a first component mounted on the circuit board, the electronic circuit comprising a first shielding layer, a first insulation layer and a second insulation layer, the second insulation layer being arranged between the first insulation layer and the first shielding layer.

Also disclosed is an electronic circuit for an audio device, the electronic circuit comprising a circuit board and one or more components including a first component mounted on the circuit board, the electronic circuit comprising a first shielding layer, a first insulation layer and a second insulation layer, the second insulation layer being arranged between the first insulation layer and the first shielding layer.

It is an advantage of the present disclosure that the encapsulation and/or shielding of the one or more components of the electronic circuit is improved while an increased design flexibility of the audio device is achieved.

Further, a combination of a first insulation layer and a second insulation layer outside the first component reduces the size of the total insulation layer outside the first component, and in turn of a first shielding layer outside the first insulation layer and/or the second insulation layer. This may in turn reduce the size of the shielding of the electronic circuit, thereby also reducing the size of the electronic circuit, and in turn the size of the audio device, while providing a reliable insulation and shielding of the electronic component.

Another advantage is that less insulation material may be required for insulating the first component.

A further advantage is that the insulation of the first component may be improved and adapted to the component to be insulated (e.g. a component with a larger height than other components), thereby providing an improved and more reliable insulation (e.g. by being able to cover the edges of the component without having insulation material flowing on the body).

A further advantage is that the shielding of the electronic component may be improved and adapted to the electronic component to be shielded, thereby providing an improved and more reliable shielding.

A further advantage of the present disclosure is that the shielding of the electronic components is minimized, whereby more compact electronic circuits may be provided, and thus also more compact audio devices. A further advantage is that the weight of the electronic circuit may be reduced e.g. because of reduced amounts of material used.

The present disclosure advantageously allows positioning large components closer to the circuit board edge in turn increasing the design flexibility when designing the electronic circuit/circuit board. Further, a reduced risk of short-circuit of electronic components via the shielding layer(s) may be provided.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1:
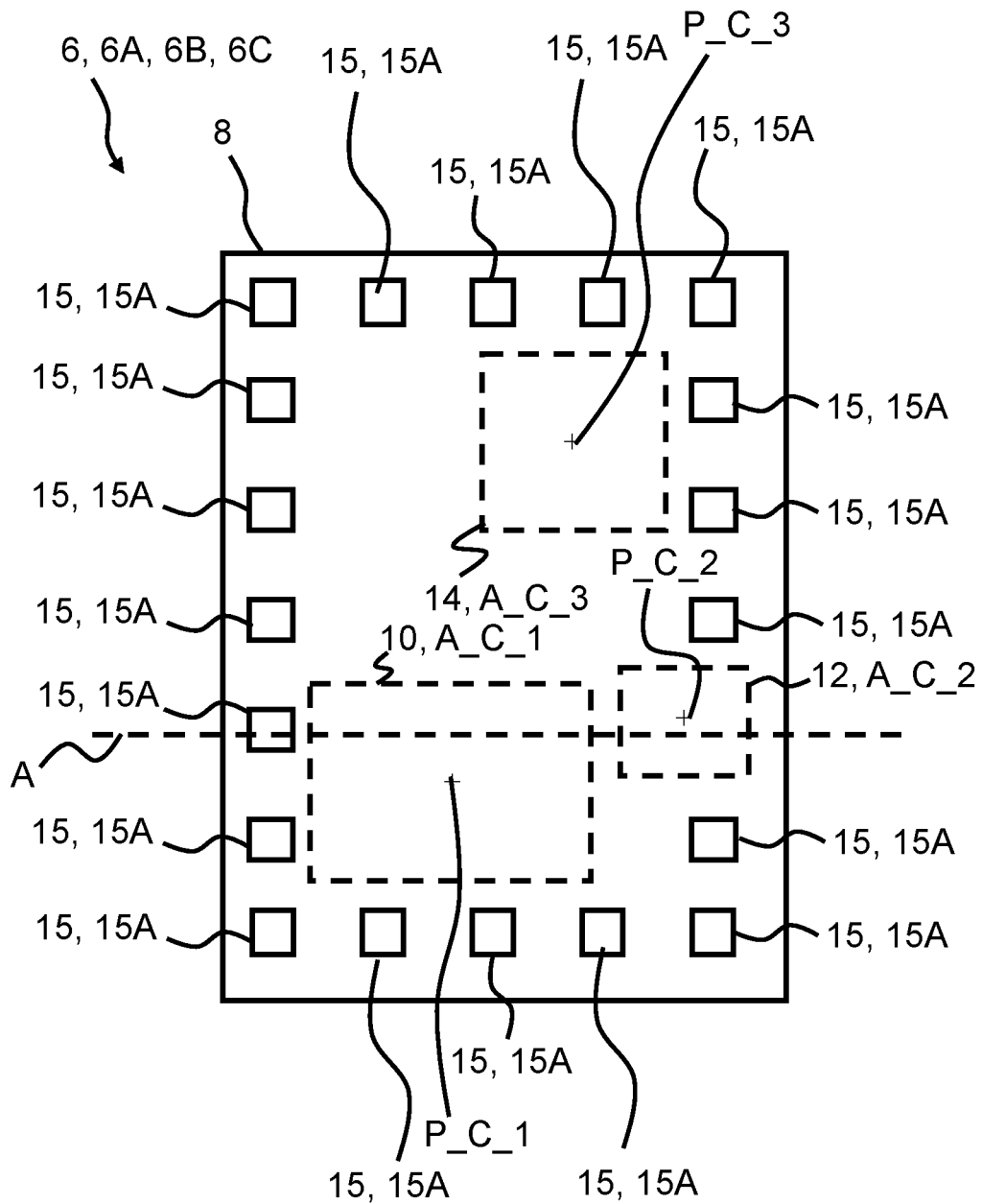
FIG. 1 schematically illustrates parts of exemplary electronic circuits according to the disclosure, FIG. 2 schematically illustrates parts of exemplary electronic circuits according to the disclosure, FIG. 3 schematically illustrates parts of exemplary electronic circuits according to the disclosure, FIG. 4 schematically illustrates parts of exemplary electronic circuits according to the disclosure, FIG. 5 schematically illustrates parts of exemplary electronic circuits according to the disclosure, FIG. 6 schematically illustrates parts of exemplary electronic circuits according to the disclosure, FIG. 7 schematically illustrates parts of exemplary electronic circuits according to the disclosure, FIG. 8 schematically illustrates parts of exemplary electronic circuits according to the disclosure.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

In the present disclosure, whenever referring to a proximal side of a component, layer, an element, a device or part of a device, the referral is to the side of the component, layer, element, device or part thereof closest to the circuit board. Further, whenever referring to a proximal surface of a component, layer, an element, a device or part of a device, the referral is to the surface of the component, layer, element, device or part thereof facing the circuit board. Likewise, whenever referring to the distal side of a component, layer, an element, a device or part of a device, the referral is to the side furthest away from the circuit board. Further, whenever referring to a distal surface of a component, layer, an element, a device or part of a device, the referral is to the surface of the component, layer, element, device or part thereof facing away from the circuit board. In other words, the proximal side or surface is the side or surface closest to the circuit board and the distal side is the opposite side or surface—the side or surface furthest away from the circuit board.

A method of manufacturing an electronic circuit of an audio device is disclosed. The method comprises providing a body. The body comprises a circuit board and one or more components including a first component mounted on the circuit board. The one or more components may comprise one or more electronic components including a first electronic component. The circuit board may e.g. be a printed circuit board, PCB, the circuit board may e.g. be configured to mechanically support and electrically connect the one or more components or electrical components using e.g. conductive tracks or pads. The circuit board may comprise one or more sheet layers of a conductive layer, laminate, or film such as of copper e.g. laminated onto and/or between sheet layers of a non-conductive substrate. The electronic circuit may be designated as a system in package electronic circuit.

The method may comprise mounting one or more components including the first component and optionally a second component on the circuit board. The one or more components, such as the first component and/or the second component may be mounted to e.g. by being soldered, embedded in the circuit board, or bonded e.g. wire bonded or adhesive bonded to the circuit board. The method may comprise mounting a plurality of components on the circuit board.

The one or more components may include a power supply unit such as switch-mode power supply e.g. comprising a switch capacitor and/or an inductor, e.g. as the first component. In other words, the first component may be a power supply unit such as switch-mode power supply e.g. comprising a switch capacitor and/or an inductor.

The one or more components may include a processing unit or chip, e.g. as the first or second component. In other words, the first component and/or the second component may be a processing unit or chip.

The one or more components may include a receiver such as a speaker, a microphone, a filter, an antenna e.g. a magnetic radio, a battery, a transceiver, and/or an interface. The one or more components may comprise a third electrical component, such as a speaker, a microphone, a filter, an antenna e.g. a magnetic radio, a battery, a transceiver, and/or an interface. The second component may be electrically and/or magnetically shielded. The third component may be non-shielded.

The one or more components may generate electromagnetic fields of different magnitudes and at different frequencies, thereby creating electromagnetic interference between the components, the electromagnetic interference being more or less disturbing for other components e.g. depending on the operating frequencies of the components and the magnitude of the electromagnetic fields. The one or more components may generate electromagnetic fields such as electrically and/or magnetically noisy. The one or more components may generate electromagnetic fields such as E-fields (electrical fields) and/or H-fields (magnetic fields).

The first component has a proximal surface and a distal surface and may have a first area $A\_C\_1$, a first height $H\_C\_1$, and a first width. The first component may for example be a power supply generating a first electromagnetic field at a first frequency (or first frequency range) and of a first magnitude. The first component may have a first position on the circuit board. The first position of the first component may e.g. be varied depending on the first area, the first height, and the first width of the component. The first position of the component may be determined based on the distance to the neighbouring components, the distance to the edge of the circuit board, and/or the height of the components. For example, it may be advantageous to position a component having the largest height in the centre of the circuit board, such as to minimize the height of the electronic circuit at the edges giving more flexibility regarding the size and dimensions of the electronic circuit. The first component may comprise a proximal surface facing towards the circuit board, and a distal surface facing away from the circuit board and optionally towards the first insulation layer (proximal surface of the first insulation layer). In one or more exemplary methods and/or electronic circuits, the first component may be positioned such that a ground connection of the first component faces towards a ground connection of the circuit board. In other words, the first component may be positioned such that a ground connection of the first component faces towards a ground pad element, such as towards a ground pad ring. An advantage of having the first component positioned such that a ground connection of the first component faces towards a ground connection of the circuit board is to reduce the risk of a short circuit connection of the first component in the event that the ground connection of the first component is short-circuited to e.g. the first shielding layer. In one or more exemplary methods and/or electronic circuits, the first component may be positioned such that the ground connection of the first component faces a corner and/or an edge of the circuit board where the one or more ground pad elements are positioned. By positioning the first component such that the ground connection of the first component faces a corner and/or an edge of the circuit board, a ground connection of the first component may be allowed for connection to one or more ground pad elements in case of a short-circuit via the first shielding layer.

A distance between two neighbouring components, e.g. a distance between the first component and the second component, may preferably be such that the first insulation layer, the second insulation, and optionally even the first shielding layer may penetrate between the components.

The method comprises applying a first insulation layer, e.g. outside, such as on the distal side of, the first component and/or on the circuit board. Applying the first insulation layer may comprise applying the first insulation layer around the first component, between the first component and the second component, e.g. at one or more first areas, including a first primary area A1_1. In other words, the method comprises applying at first insulation layer on the distal side of the first component, i.e. the first component is arranged between the circuit board and the first insulation layer or at least a first area of the first insulation layer. Applying a first insulation layer outside the first component may comprise applying the first insulation layer on the distal surface of the first component. Applying a first insulation layer may comprise applying a first insulation layer outside a plurality of components e.g. applying a portion of the first insulation layer on each component individually or applying a first insulation layer on a plurality of components such that the first insulation layer is substantially continuous on the plurality of components. Applying a first insulation layer may comprise conformal coating of the first insulation layer. Conformal coating may provide a uniform first insulation layer on the component(s), such as the first component and/or on the second component, and minimize the thickness of the first insulation layer that is needed to cover the component(s).

The method comprises applying a second insulation layer, e.g. outside, such as on the distal side of, the first component, on the circuit board, and/or on the distal side or on the first insulation layer. In other words, the method comprises applying a second insulation layer on the distal side of the first component and/or the first insulation layer, i.e. the first component and the first insulation layer are arranged between the circuit board and the second insulation layer or at least a first area of the second insulation layer. Applying a second insulation layer outside the first component and/or the first insulation layer may comprise applying the second insulation layer on the distal surface of the first component the first insulation layer. Applying a second insulation layer may comprise applying a second insulation layer outside a plurality of components e.g. applying a portion of the second insulation layer on each component individually or applying a second insulation layer on a plurality of components such that the second insulation layer is substantially continuous on the plurality of components. Applying a second insulation layer may comprise conformal coating of the second insulation layer. Conformal coating may provide a uniform second insulation layer on the component(s), such as the first component and/or on the second component, and minimize the thickness of the second insulation layer that is needed to cover the component(s).

The first insulation layer may contact or be substantially in contact with, e.g. adhering to, component(s), e.g. the first component and/or the second component, for example such that the proximal surface (or at least a part) of the first insulation layer adheres to the distal surface and/or the side surface of the first component and/or the second component. It may be advantageous that the first insulation layer adheres to the first component and/or the second component, such that substantially no air is trapped between the first insulation layer and at least the distal surface of the first component and/or the second component. This may further avoid that any moisture penetrates and collects between the first insulation layer and the component(s), such as the first component and/or the second component, which may lead to damage or misfunction of the component(s).

The second insulation layer may contact or be substantially in contact with, e.g. adhering to, the first insulation layer, for example such that the proximal surface (or at least a part) of the second insulation layer adheres to the distal surface of the first insulation layer. In the same way, it may be advantageous that the second insulation layer adheres to the first insulation layer, such that substantially no air is trapped between the second insulation layer and the first insulation layer. It is to be understood that further insulation layers, such as a third insulation layer, a fourth insulation layer, and/or one or more adhesive layers may be applied and/or arranged between the first insulation layer and the first shielding layer. In an exemplary method/electronic circuit, a second insulation layer of a second insulation material (optionally with a second viscosity different from such as lower or higher than the first viscosity) may be applied and/or arranged between the circuit board and the component(s) and/or in gaps between neighbouring components. Accordingly, the method may comprise applying a second insulation material to the circuit board, the first insulation layer and/or between components. Applying a second insulation material to the circuit board and/or between components may comprise underfilling the second insulation material. In other words, the second insulation layer may be built up on top of the first insulation layer. It is an advantage that the first insulation layer is cured before applying the second insulation layer, e.g., instead of applying only one insulation layer that may flow out on the body before being cured since large amount of insulation material may have to be used to cover the component to insulate. An advantage of the present disclosure is therefore that smaller amounts of insulation material are used. The first insulation layer and the second insulation layer may be applied in a targeted manner in specific areas, instead of flooding the body to cover the component to insulate. In other words, the applying of the first insulation layer and the second insulation layer may be a dedicated application. A sequential applying of the first insulation layer and the second insulation layer may be achieved when using the disclosed technique.

The first insulation layer and/or second insulation layer may be said to encapsulate or cover one or more of the components, such as the first component and/or the second component, such that the component(s) may be protected from the surrounding environment.

The first insulation layer and/or second insulation layer may be an electrically non-conductive layer such that no electrical or galvanic contact may be established to the first component, e.g. from the first shielding layer. Thus, the first insulation layer may be made of a first insulation material optionally comprising one or more polymers. Thus, the second insulation layer may be made of a second insulation material optionally comprising one or more polymers. The first insulation material and the second insulation material may be of the same material. The first insulation material and/or the second insulation material may be electrically non-conductive materials.

The first insulation layer and/or second insulation layer may insulate the first component from the first shielding layer. In other words, the first insulation layer and/or second insulation layer may prevent galvanic contact between the first component and the first shielding layer.

In one or more exemplary methods, the first material has a first viscosity prior to curing of in the range from 0.30 Pa·s to 200 Pa·s.

The first insulation layer may have a first viscosity associated with the first insulation material (prior to curing) and/or a first thickness T_FIL_1 associated with the first component. The first thickness T_FIL_1 may preferably be the thickness of the first insulation layer as the final product i.e. after the last processing step has been performed on the first insulation layer. The first viscosity may e.g. be in the range from 0.2 Pa·s to 300 Pa·s, in the range from 0.5 Pa·s to 175 Pa·s, in the range from 1 to 30 Pa·s, in the range from 1 Pa·s-20 Pa·s, or in the range from 3 Pa·s to 10 Pa·s, when measured at a temperature of 20-25° C. In one or more exemplary methods and/or electronic circuits, the first viscosity of the first insulation material may be in the range from 80 Pa·s to 120 Pa·s, such as about 100 Pa·s. The first thickness may also be understood as a first distance from the proximal surface of the first insulation layer to the distal surface of the first insulation layer, e.g. to the proximal surface of the first shielding layer. The first insulation layer may have a second thickness associated with the second component. The first thickness of the first insulation layer may be the same or different from, such as larger than or smaller than the second thickness of the first insulation layer. The first thickness T_FIL_1 of the first insulation layer may be defined as the maximal thickness of the first insulation layer i.e. the point or area where the first insulation layer is the thickest in the first area A_C_1 of the first component. The first insulation layer may comprise a first height H_FIL_1. The first height H_FIL_1 may be defined as the distance between the surface of the circuit board facing the proximal surface of the first insulation layer and the distal surface of the first insulation layer at the maximal point or area of the first insulation layer at the first area A_C_1 of the first component. The first height H_FIL_1 may substantially correspond to the first thickness T_FIL_1 added with the first height of the first component H_C_1. The second thickness T_FIL_2 of the first insulation layer may be defined as the maximal thickness of the first insulation layer i.e. the point or area where the first insulation layer is the thickest in the second area A_C_2 of the second component. The first insulation layer may comprise a second height H_FIL_2. The second height H_FIL_2 may be defined as the distance between the surface of the circuit board facing the proximal surface of the first insulation layer and the distal surface of the first insulation layer at the maximal point or area of the first insulation layer at the second area A_C_2 of the second component. The second height H_FIL_2 may substantially correspond to the second thickness T_FIL_2 added with the second height of the second component H_C_2.

The second insulation layer may have a second viscosity associated with the second insulation material (prior to curing) and/or a first thickness T_SIL_1 associated with the first component. The first thickness T_SIL_1 may preferably be the thickness of the second insulation layer as the final product i.e. after the last processing step has been performed on the second insulation layer. The second viscosity may e.g. be in the range from 0.2 to 300 Pa·s, in the range from 0.5 to 175 Pa·s, in the range from 1 to 30 Pa·s, in the range from 1-20 Pa·s, or in the range from 3 to 10 Pa·s, when measured at a temperature of 20-25° C. In one or more exemplary methods and/or electronic circuits, the second viscosity of the second insulation material may be in the range from 80 Pa·s to 120 Pa·s, such as about 100 Pa·s. The first thickness T_SIL_1 may also be understood as a second distance from the distal surface of the first insulation layer to the distal surface of the second insulation layer, e.g. to the proximal surface of the first shielding layer. The second insulation layer may have a second thickness associated with the second component. The second thickness of the second insulation layer may be the same or different from, such as larger than or smaller than the first thickness of the first insulation layer. The second thickness T_SIL_2 of the second insulation layer may be defined as the maximal thickness of the second insulation layer i.e. the point or area where the second insulation layer is the thickest in the second area A_C_2 of the first component. The second insulation layer may comprise a first height H_SIL_1. The first height H_SIL_1 may be defined as the distance between the surface of the circuit board facing the proximal surface of the first insulation layer and the distal surface of the second insulation layer at the maximal point or area of the second insulation layer at the second area A_C_2 of the first component. The first height H_SIL_1 may substantially correspond to the first thickness T_SIL_1 and the first thickness T_FIL_1 added with the first height of the first component H_C_1. The second thickness T_SIL_1 of the second insulation layer may be defined as the maximal thickness of the second insulation layer i.e. the point or area where the second insulation layer is the thickest in the second area A_C_2 of the second component. The second insulation layer may comprise a second height H_FIL_2. The second height H_FIL_2 may be defined as the distance between the surface of the circuit board facing the proximal surface of the first insulation layer and the distal surface of the second insulation layer at the maximal point or area of the second insulation layer at the second area A_C_2 of the second component. The second height H_FIL_2 may substantially correspond to the second thickness T_SIL_1 added with the second height of the second component H_C_2.

The first viscosity and the first thickness may e.g. be chosen based on one or more of the distance or gap between the components, the method of applying the first insulation layer, and the type of component. For example, for a smaller distance between the components, i.e. a smaller gap, the viscosity of the first insulation material may be lower than for a larger distance between the components, i.e. a larger gap. This may allow the first insulation material to penetrate gaps between the components. The gap between two neighbouring components, e.g. between the first component and the second component may e.g. be in the range from 1 µm to 1 cm, in the range from 5 µm to 5 mm, in the range from 10 µm to 1 mm, in the range from 20 µm to 500 µm, in the range from 20 µm to 200 µm, in the range from 20 µm to 100 µm, in the range from 500 µm to 1 cm, or in the range from 1 mm to 5 mm. In one or more exemplary methods and/or electronic circuits, the gap between two neighbouring components, e.g. between the first component and the second component may e.g. be in the range from 20 µm to 20 mm. The viscosity of the first insulation material may be proportional to the distance between the components. A lower viscosity e.g. in the range from 1 to 20 Pa·s may be preferred for smaller gaps e.g. gaps smaller than 500 µm, e.g. to promote the flowing of the first insulation material into smaller gaps. A higher viscosity may be preferred e.g. to avoid that the first insulation material flows out of the circuit board or unintentionally covers portions of the circuit board, such as ground pad elements.

The first insulation layer may comprise a plurality of portions, e.g. a first portion and a second portion, separated from each other. The first portion of the first insulation layer may cover and insulate the first component. The second portion of the first insulation layer may cover and insulate the second component.

The first insulation layer may comprise a plurality of portions, e.g. a first portion and a second portion, separated from each other. The first portion of the first insulation layer may cover and insulate the first component. The second portion of the first insulation layer may cover and insulate the second component.

An adhesive layer or coating may be applied before applying the first insulation layer, e.g. for promoting adhesion of the first insulation layer. An adhesive layer or coating may be applied after applying the first insulation layer and/or the second insulation layer, and before applying the first shielding layer, e.g. for promoting adhesion of the first shielding layer.

In one or more exemplary methods, the first insulation layer is made of a first insulation material comprising one or more polymers. The first insulation layer may be made of a first insulation material, for example comprising, essentially consisting of, or be of a polymer material. The first insulation layer may be of a non-conductive material, e.g. a non-electrically conductive polymer material. The first insulation material may be a material that cures by polymerization induced by UV light source. The first insulation material may be a material that cures through solvent removal induced by heating. Examples of first insulation materials may be acrylated polyurethane (e.g. Electrolube® UVCL, HumiSeal® UV40, HumiSeal® UV40-250, HumiSeal® UV40 Gel, and/or HumiSeal® UV40HV), acrylate, epoxy resin (e.g. Namics® U8443, Elpeguard® SL 1367, and/or Humiseal® 1R32A-2). The first thickness T_FIL_1 of the first insulation layer may be in the range from 10 µm to 500 µm, in the range from 50 µm to 400 µm, in the range from 100 µm to 300 µm, or in the range from 100 µm to 200 µm. The second thickness T_FIL_2 of the first insulation layer may be in the range from 10 to 500 µm, in the range from 50 µm to 400 µm, in the range from 100 µm to 300 µm, or in the range from 100 µm to 200 µm.

The first insulation material may e.g. comprise and/or function as an underfill material having low viscosity, i.e. lower than 15 Pa·s, such as lower than 1 Pa·s. Thereby, the first insulation layer may penetrate around and below the first component and/or the second component.

The method comprises applying one or more shielding layers including a first shielding layer. The first shielding layer may cover at least a part of the second insulation layer and/or the first insulation layer. The first shielding layer may be applied outside, such as on the distal side of, the first insulation layer, on the circuit board, and/or the second insulation layer. In other words, the method comprises applying at first shielding layer, e.g. a first portion and/or a second portion, on the distal side of the first insulation layer, i.e. the first insulation layer (first area of the first insulation layer) is arranged between the first component and the first shielding layer (first area of the first shielding layer). Applying a first shielding layer outside the first insulation layer may comprise applying the first shielding layer on the distal surface of the first insulation layer. Thus, the proximal surface of the first insulation layer faces towards the circuit board and the distal surface of the first insulation layer may be facing towards the first shielding layer (proximal surface of the first shielding layer). The first shielding layer has a proximal surface facing towards the circuit board and optionally facing the distal surface of the first insulation layer.

The first shielding layer may contact or be substantially in contact with, e.g. adhering to, the first insulation layer and/or the second insulation layer, for example such that the proximal surface (or at least a part) of the first shielding layer adheres to the distal surface of the first insulation layer and/or of the second insulation layer. In the same way, it may be advantageous that the first shielding layer adheres to the first insulation layer and/or the second insulation layer, such that substantially no air is trapped between the first shielding layer and the first insulation layer and/or the second insulation layer. It is to be understood that further insulation layers, such as a third insulation layer, a fourth insulation layer and/or one or more adhesive layers may be applied and/or arranged between the first insulation layer and/or the second insulation layer and the first shielding layer. Further, it is to be understood that further shielding layers, such as second shielding layer and/or third shielding layer may be applied outside the first shielding layer, e.g. between the first shielding layer and the first protection layer.

The first shielding layer may be an electrically conducting layer. Thus, the first shielding layer may be made of a first shielding material. The first shielding material may be an electrically conductive material. The conductivity of the first shielding layer may be in the range from 1 µΩ·cm to 100 mΩ·cm.

The first shielding layer may shield component(s), such as the first component and/or the second component, from electromagnetic radiation (act as a Faraday cage), optionally from other components of the electronic circuit. In other words, the shielding layer may prevent electromagnetic radiation disturbing the components. On the other hand, the first shielding layer may shield other component(s) of the circuit board from electromagnetic radiation generated by the first component and/or the second component. The shielding provided by the first shielding layer may be in the range of 1 dB to 200 dB depending on the frequency or frequency range to shield. The first shielding layer may be made of a first shielding material being a conductive material, e.g. an electrically conductive polymer material. The first shielding material may be conductive polymer material, e.g. a conductive coating, e.g. based on inorganic or organic material, a conductive ink, a conductive micro-ink comprising micrometer-sized particles, or a conductive nano-ink comprising nanometer-sized particles. Examples of first shielding materials may be Genes'ink® Smart spray S-CS11101, Genes'ink® Smart'ink S-CS21303, Genes'ink® Smart'ink S-CS01520, Tatsuta® AE1244, Tatsuta® AE5000A5, Tatsuta® AE5000L, Tatsuta® AE5000ST, or Tatsuta® SF-PC5600.

The first shielding layer may have a first viscosity associated with the first shielding material and/or a first thickness associated with the first component. The first viscosity of the first shielding material may (prior to curing) e.g. be in the range from 0.001 Pa·s to 200 Pa·s, in the range from 0.01 Pa·s to 100 Pa·s, in the range from 1 to 50 Pa·s, in the range from 1 Pa·s to 30 Pa·s, in the range from 1 Pa·s to 20 Pa·s, in the range from 3 Pa·s to 10 Pa·s, in the range from 0.001 Pa·s to 10 Pa·s, or in the range from 0.005 Pa·s to 10 Pa·s, e.g. measured at a temperature of 20-25° C. The first thickness of the first shielding layer may also be understood as a first distance from the proximal surface of the first shielding layer to the distal surface of the first shielding layer. The first shielding layer may have a second thickness associated with the second component. The first thickness of the first shielding layer may be the same or different from, such as larger than or smaller than the second thickness of the first shielding layer. The first thickness $T\_FSL\_1$ of the first shielding layer may be defined as the maximal thickness of the first shielding layer i.e. the point or area where the first shielding layer is the thickest at the first area $A\_C\_1$ of the first component. The first shielding layer may comprise a first height $H\_FSL\_1$. The first height $H\_FSL\_1$ may be defined as the distance between the surface of the circuit board facing the proximal surface of the first shielding layer and the distal surface of the first shielding layer at the maximal point or area of the first shielding layer at the first area $A\_C\_1$. The first height $H\_FSL\_1$ may substantially correspond to the first thickness $T\_FSL\_1$, added to the first thickness $T\_FIL\_1$ and/or the first thickness $T\_SIL\_1$ and added with the first height of the first component $H\_C\_1$. The first thickness $T\_FSL\_1$ may preferably be the thickness of the first shielding layer as the final product i.e. after the last processing step has been performed on the first shielding layer. The second thickness $T\_FSL\_2$ of the first shielding layer may be defined as the maximal thickness of the first shielding layer i.e. the point or area where the first shielding layer is the thickest at the second area $A\_C\_2$ of the second component. The first shielding layer may comprise a second height $H\_FSL\_2$. The second height $H\_FSL\_2$ may be defined as the distance between the surface of the circuit board facing the proximal surface of the first shielding layer and the distal surface of the first shielding layer at the maximal point or area of the first shielding layer at the second area $A\_C\_2$. The second height $H\_FSL\_2$ may substantially correspond to the second thickness $T\_FSL\_2$, added to the second thickness $T\_FIL\_2$ and/or the second thickness $T\_SIL\_2$ and added with the second height of the second component $H\_C\_2$. The second thickness $T\_FSL\_2$ may preferably be the thickness of the first shielding layer as the final product i.e. after the last processing step has been performed on the first shielding layer.

Properties of exemplary electronic circuits EC1-EC4 are outlined in table 1 below. The second component of EC1-EC4 may be omitted.

TABLE 1

Properties of exemplary electronic circuits

|  | EC1 | EC2 | EC3 | EC4 |
|---|---|---|---|---|
| $A\_C\_1$ | 5-10 mm² | 8-9 mm² | 0.5-2 mm² | 1-10 mm² |
| $H\_C\_1$ | 0.5-2 mm | NA | <1 mm | >$H\_C\_2$ |
| $A\_C\_2$ | 2-7 mm² | 3-4 mm² | 6-8 mm² | 1-10 mm² |
| $H\_C\_2$ | 0.5-2 mm | NA | <1 mm | <1 mm |
| $T\_FIL\_1$ | 10-30 µm | 20-30 µm | 20-30 µm | <$T\_FIL\_2$ |
| $T\_FIL\_2$ | 35-60 µm | 45-55 µm | 30-40 µm | >30 µm |
| $T\_SIL\_1$ | 10-30 µm | 20-30 µm | 20-30 µm | <$T\_SIL\_2$ |
| $T\_SIL\_2$ | 10-200 µm | 10-200 µm | 10-200 µm | >30 µm 10-200 µm |
| $T\_FSL\_1$ | 50-150 µm | 80-120 µm | 30-70 µm | <120 µm |
| $T\_FSL\_2$ | 150-250 µm | 180-220 µm | 60-70 µm | >$T\_FSL\_2$ |

The first viscosity and the first thickness of the first shielding layer may e.g. be chosen based on one or more of the distance or the gap between the components, the method of applying the shielding layer, the type of component, and properties of the first insulation layer. For example, for a smaller distance between the components, i.e. a smaller gap, the viscosity of the first shielding material may be lower than for a larger distance between the components, i.e. a larger gap. This may allow the first shielding material to penetrate between the components. The viscosity of the first shielding material may be proportional to the distance between the components.

The first thickness of the first shielding layer may depend on a frequency of the generated electromagnetic interference by the first component to be shielded. The frequency to be shielded may be determined based on the operating frequency of one or more components of the electronic circuit. For example, an antenna may operate at a frequency that matches a frequency of the generated electromagnetic interference of a component, such as the first component. In that case it may be important to shield that specific frequency such that the antenna may operate without being disturbed. Thus, depending on the frequency of the generated electromagnetic interference to be shielded, the first thickness of the first shielding layer may be varied. The shielded frequency is dependent on the thickness of the first shielding layer. For example, in order to shield an electromagnetic interference having a frequency about 1 MHz, the first thickness, $T\_FSL\_1$, of the first shielding layer may be in the range from 1 µm to 500 µm, in the range from 10 µm to 300 µm, in the range from 20 µm to 200 µm, in the range from 30 µm to 100 µm, or in the range from 50 µm to 80 µm.

The first shielding material may be selected depending on the frequency or frequency range to be shielded. The frequency range to be shielded may e.g. be in the range from 0.1 kHz to 10 GHz or in the range from 1 MHz-1 GHz.

The first shielding material may comprise one or more metals including a first metal and/or a second metal. The first shielding material may comprise a base material, such as a base matrix of a polymer, such as epoxy resin comprising metal particles. The one or more metals may be selected from copper, silver, gold, platinum, and nickel. The first shielding material may comprise an alloy. The first shielding material may be or comprise a conducive polymer. The first shielding material may comprise metal particles, such as µm metal particles and/or nm metal particles. The metal particles may be or comprise copper particles, silver particles, gold particles, zinc particles, and/or nickel particles. The first shielding material may comprise copper particles that are silver coated. The metal particles may have a concentration in the first shielding material in the range from 1 to 100 wt %, such as in the range from 5 to 30 wt %.

The first shielding layer may comprise a plurality of portions, e.g. a first portion and a second portion, separated from each other. The first portion of the first shielding layer may cover and shield the first component. The second portion of the first shielding layer may cover and insulate the second component.

In one or more exemplary methods, applying a first insulation layer comprises jetting the first insulation layer and curing the first insulation layer. Jetting the first insulation layer may comprise jetting first insulation material on the first component, e.g. on distal surface of the first component. In one or more exemplary methods, jetting first insulation material on the first component may be combined with masking prior to jetting first insulation material, e.g. by arranging a masking element. Thus, in one or more exemplary methods, applying a first insulation layer outside the first component comprises applying a masking before jetting the first insulation material. Jetting first insulation material may comprise printing first insulation material on the first component and/or circuit board. Jetting the first insulation material may allow for a more automized and accurate application of the first insulation layer, e.g. by removing human steps in the manufacturing of the electronic circuit. This may provide a higher uniformity of the layers applied e.g. the thickness of the layers, and in turn provide more reliable layers. Further, introduction of potential human/operator-related contamination on the boards-to-be-coated can be reduced and/or prevented.

In one or more exemplary methods, jetting the first insulation layer comprises applying one or more droplets of first insulation material, the droplets having a volume in the range from 0.01 µL to 0.1 µL. In other words, the droplets may have a volume per droplet in the range from 0.01 µL/dot to 0.1 µL/dot. In one or more exemplary methods, the droplets may have a density in the range from 0.01 mg/dot to 0.1 g/dot. In one or more exemplary methods, the first insulation material may have a density in the range from 0.5 g/mL to 20 g/m L.

The volumes and densities may be provided at a temperature in a range from 20° C. to 25° C.

In one or more exemplary methods, jetting the first insulation layer comprises jetting one or more first areas including a first primary area A1_1 of the body and optionally a first secondary area A1_2. The first primary area A1_1 may be an area around and/or on the first area A_C_1 of the first component. The first secondary area A1_2 may be an area around and/or on the second area A_C_2 of the second component.

In one or more exemplary methods, jetting the second insulation layer comprises jetting one or more second areas including a second primary area A2_1 of the body and optionally a second secondary area A2_2. The second primary area A2_1 may be an area around and/or on the first area A_C_1 of the first component. The second secondary area A2_2 may be an area around and/or on the second area A_C_2 of the second component.

In one or more exemplary methods, the first primary area and the second primary area is partly overlapping. The overlapping area may be identified after the electronic circuit has been manufactured, e.g. a transition may be identified by microscope at the overlapping area. For example, the molecular structure of the first insulation layer after curing may look differently than the molecular structure of the second insulation layer after curing.

Curing the first insulation layer may comprise curing the first insulation material.

In one or more exemplary methods, curing the first insulation layer comprises UV-curing the first insulation layer.

Curing the first insulation layer may comprise, e.g. low-temperature curing, heat-curing, moisture-curing, UV-curing, infrared light curing, near infrared light curing, or photonic curing. The UV-curing may be performed at a wavelength in the range of 100 nm to 400 nm, e.g. for the first insulation materials curing by polymerization. The curing may be performed using flooding exposure, e.g. for a period in the range of 0.5 s to 30 s. The curing time may vary depending on the thickness of the insulation layer. For example, the first insulation layer may require certain dose before being cured, such as a UV dose. For example, the first insulation layer may require a higher dose and/or a longer curing time to be cured properly. The dose provided during the curing may vary depending on the wavelength used and the time of exposure. The dose provided during the curing may be in the range from 0.1 J/cm$^2$ to 10 J/cm$^2$. In other words, the irradiance provided during curing may be in the range from 0.1 W/cm$^2$ to 1.15 W/cm$^2$. A preferred UV light for the curing may be UV-C light, as a faster curing may be achieved. This may be advantageous in order to avoid that the first insulation layer flow out before being cured.

The curing temperature may e.g., be in the range from 60° C. to 500° C., in the range from 60° C. to 400° C., in the range from 80° C. to 300° C., or in the range from 50° C. to 200° C., e.g., for the insulation materials cured by solvent removal. The curing of the first insulation material may comprise evaporating part of the first insulation material. The composition of the first insulation material may therefore be different after the first insulation material have been cured. The first thickness T_FIL_1 may also be different before and after curing e.g., T_FIL_1 is thinner after curing than before. The curing of the first insulation material may comprise polymerization reaction due to the UV light source. Moreover, for UV-curable materials, a secondary moisture-curing mechanism may be applied, e.g., for shadowed areas.

In one or more exemplary methods, applying a second insulation layer comprises jetting the second insulation layer and curing the second insulation layer, e.g., after that the first insulation layer has been jetted and cured.

Jetting the second insulation layer may comprise jetting second insulation material on the first component, e.g., on distal surface of the first component. In one or more exemplary methods, jetting second insulation material on the first component may be combined with masking prior to jetting second insulation material, e.g., by arranging a masking element. Thus, in one or more exemplary methods, applying a second insulation layer outside the first component comprises applying a masking before jetting the second insulation material. Jetting second insulation material may comprise printing second insulation material on the first component and/or circuit board. Jetting the second insulation material may allow for a more automized and accurate application of the second insulation layer, e.g., by removing human steps in the manufacturing of the electronic circuit. This may provide a higher uniformity of the layers applied e.g., the thickness of the layers, and in turn provide more reliable layers. Further, introduction of potential human/operator-related contamination on the boards-to-be-coated can be reduced and/or prevented.

Curing the second insulation layer may comprise curing the second insulation material.

Curing the second insulation layer may comprise, e.g., low-temperature curing, heat-curing, moisture-curing, UV-curing, infrared light curing, near infrared light curing, or photonic curing. The UV-curing may be performed at a wavelength in the range of 100 nm to 400 nm. The curing may be performed using flooding exposure, e.g., for a period in the range of 0.5 s to 10 s. The curing time may vary depending on the thickness of the insulation layer. For example, the second insulation layer may require certain dose before being cured, such as a UV dose. The dose provided during the curing may vary depending on the wavelength used and the time of exposure. The dose provided during the curing may be in the range from 0.1 J/cm$^2$ to 10 J/cm$^2$. In other words, the irradiance provided during curing may be in the range from 0.1 W/cm$^2$ to 1.15 W/cm$^2$. The dose provided during the curing may depend on the wavelength of the light source that is used. A preferred UV light for the curing may be UV-C light, as a faster curing may be achieved. This may be advantageous in order to avoid that the second insulation layer flow out before being cured.

The curing temperature may e.g., be in the range from 60° C. to 500° C., in the range from 60° C. to 400° C., in the range from 80° C. to 300° C., or in the range from 50° C. to 200° C. The curing of the second insulation material may comprise evaporating part of the second insulation material. The composition of the second insulation material may therefore be different after the second insulation material have been cured. The first thickness $T\_SIL\_1$ may also be different before and after curing e.g., $T\_SIL\_1$ is thinner after curing than before. The curing of the second insulation material may comprise polymerization reaction due to the UV light source. Moreover, for UV-curable materials, a secondary moisture-curing mechanism may be applied, e.g., for shadowed areas.

In one or more exemplary methods, curing the second insulation layer comprises UV-curing the second insulation layer to form a first interface between the first insulation layer and the second insulation layer. The first interface may be identified after the electronic circuit has been manufactured, e.g., a transition may be identified by microscope at the first interface. For example, the molecular structure of the first insulation layer after curing may look differently than the molecular structure of the second insulation layer after curing.

Both the applying of the first insulation layer, the applying of the second insulation layer, and the applying of the first shielding layer may be achieved by jetting, which allows the use of the same machine for all three steps. By using the same machine, the number of fabrication steps of the electronic circuit may be reduced, whereby an easier and faster fabrication process may be achieved. Jetting first insulation material and/or second insulation material may e.g. comprise one or more of screen printing, inkjet, and aerosol printing. The jetting may e.g. be tilt jetting e.g. to provide a more uniform layer and/or provide a better coverage of component terminals.

In one or more exemplary methods, applying the first shielding layer outside the first insulation layer comprises contacting the first shielding layer, such as the first portion and/or the second portion of the first shielding layer, to a ground connection, such as to one or more ground pad elements, e.g. of a ground pad ring. The ground connection may e.g. be a ground connection of the circuit board, a ground connection through the first component being connected to a ground connection of the circuit board, a ground pad ring e.g. at least partly encircling the first component. The ground connection may comprise one or more ground pad elements.

The ground pad ring may be a continuous ring such that the ground pad ring is whole. The ground pad ring may be formed by a number of ground pad elements arranged along a closed curve, e.g. encircling the first component and/or the second component. A ground pad ring having a continuous ring may provide greater flexibility for the grounding of the first shielding layer. The continuous ring of the ground pad ring may have a width in the range from 1 µm to 500 µm, 100 µm to 500 µm, 200 µm to 500 µm, 1 µm to 100 µm, preferably between 5-50 µm, more preferably between 10-50 µm.

In one or more exemplary methods/electronic circuits, the first shielding layer is not contacted to a ground connection but is outside the first insulation layer without being in contact with a ground connection.

In one or more exemplary methods, applying a first insulation layer outside the first component comprises moulding first insulation material on the first component, e.g. on distal surface of the first component. Moulding first insulation material may comprise to provide a mould around the first component e.g. to delimit the area to mould, and then applying first insulation material on the first component, e.g. by injecting first insulation material into the space/cavity between the mould and the first component/circuit board.

In one or more exemplary methods, applying a first insulation layer outside the first component comprises spraying first insulation material on the first component. Applying a first insulation layer outside the first component may comprise masking, e.g. by arranging a masking element, e.g. prior to spraying first insulation material on the first component. Thus, application of first insulation material to selected areas is provided for e.g. preventing ground connection from being covered with first insulation material.

In one or more exemplary methods, applying a first shielding layer outside the first component comprises curing the first shielding material.

Curing the first shielding material may comprise, e.g. low-temperature curing, heat-curing, moisture curing, UV-curing, infrared light curing, near infrared light curing, or photonic curing. The curing temperature may e.g. be in the range from 60° C. to 500° C., in the range from 60° C. to 400° C., in the range from 80° C. to 300° C., in the range from 50° C. to 200° C., or in the range from 150° C. to 180° C. The curing of the first shielding material may comprise evaporating part of the first shielding material. The composition of the first shielding material may therefore be different after the first shielding material has been cured. After the curing, the metal particles of the first shielding layer may e.g. be more concentrated than before curing, providing a higher density of metal particles, whereby a higher conductivity may be achieved. The first thickness $T\_FSL\_1$ may also be different before and after curing e.g. $T\_FSL\_1$ is thinner after curing than before curing. The curing of the first shielding material may comprise polymerization reaction due to the UV light source. Moreover, for UV-curable materials, a secondary moisture-curing mechanism may be applied, e.g. for shadowed areas.

In one or more exemplary methods, applying a first shielding layer outside the first component comprises moulding first shielding material on the first component.

In one or more exemplary methods, applying a first shielding layer outside the first component comprises spraying first shielding material on the first component. Spraying first shielding material on the first component may be advantageous for low-viscosity material.

In one or more exemplary methods, applying a first shielding layer outside the first component comprises jetting first shielding material on the first component.

In one or more exemplary methods, applying a first shielding layer outside the first component comprises applying a masking before jetting, spraying or otherwise applying the first shielding material. Thereby, improved control of the application of first shielding material may be provided.

Jetting first shielding material may e.g. comprise inkjet and/or aerosol printing. The jetting may e.g. be tilt jetting e.g. to provide a more uniform layer.

In one or more exemplary methods, applying a first shielding layer outside the first component comprises covering the first component with first shielding material.

In one or more exemplary methods, the body comprises a plurality of circuit boards and one or more components including a first component mounted on each of the circuit boards, and wherein applying a first insulation layer comprises applying a first insulation layer to each of the circuit boards before applying the second insulation layer. A body comprising a plurality of circuit boards may also be denoted a panel, such as a PCB panel.

Applying a first insulation layer may comprise jetting a first number of circuit boards, such as a first row of circuit boards on the body, for a first jetting time period. The first jetting time period may be in the range from 0.5 s to 20 s or 0.5 s to 10 s per circuit board and/or component. The first jetting time period may depend on the first number of circuit boards to be jetted. The first jetting time period may depend on one or more of the droplet size, the panel size, the circuit board size, and the first component size and/or the second component size.

Applying a first insulation layer may comprise curing the first insulation layer jetted on the first number of circuit boards, for a first curing time period in the range from 0.5 s to 20 s or 0.5 s to 10 s per insulation layer, such as first insulation layer, per circuit board and/or per panel. The first curing time period may for example depend on the thickness of the first insulation layer and/or the first insulation material. An advantage of this, is that it may be avoided that the first insulation layer flows out on the body, e.g., when too many circuit boards are processed at a time, before being cured. In other words, it may be avoided that the first insulation layer flows out on the body while applying the remaining first insulation layer on the rest of the body.

Applying a first insulation layer may comprise jetting a second number of circuit boards, such as a second row of circuit boards on the body, for a second jetting time period in the range from 0.5 s to 20 s or 0.5 s to 10 s per circuit board and/or component. The second jetting time period may depend on the first number of circuit boards to be jetted. The second jetting time period may depend on one or more of the droplet size, the panel size, the circuit board size, the first component size, and the second component size. The second jetting time period may be different or equivalent to the first jetting time period.

Applying a first insulation layer may comprise curing the first insulation layer on the second number of circuit boards, for a second curing time period in the range from 0.5 s to 20 s or 0.5 s to 10 s per insulation layer, such as second insulation layer, per circuit board and/or per panel. The second curing time period may for example depend on the thickness of the second insulation layer and/or the second insulation material.

Applying a first insulation layer to each of the circuit boards before applying the second insulation layer may comprise repeating the above jetting and curing steps for all the circuit board of the body for the first insulation layer before applying the second insulation layer. An advantage of this, is that the first insulation layer may be cured for the entire body before applying the second insulation layer.

In one or more exemplary methods, applying a second insulation layer comprises applying a second insulation layer to each of the circuit boards before applying the first shielding layer.

The method may comprise applying a first protection layer outside the first shielding layer. The first protection layer may be an environment protecting layer protecting the first shielding layer, the first insulation layer, the first component, and more generally the electronic circuit (or at least parts thereof) and the audio device e.g. from the surrounding environment such as climate, e.g. climate-related stressors (moisture, temperature, liquid water), climate-related contaminants (e.g. dust), and/or human, e.g. human-related contaminants (human secretion products, e.g. cerumen, sebum, sweat). The first protection layer may fully cover the first insulation layer and/or the first shielding layer.

The first protection layer may be made of a first protection material. The first protection material may be the same as the first insulation material. The first protection material may comprise or essentially consist of a similar or the same material as the first insulation material of the first insulation layer. This may be an advantage with regards to the adhesion between the first protection layer, the first shielding layer, and the first insulation layer. Further, use of the same material for the first insulation layer and the first protection layer simplifies the manufacture of the electronic circuit. The first protection material may alternatively be different from the first insulation material. The first protection layer may protect the first shielding layer from corroding. This may avoid e.g. an unwanted connection between one or more components. An unwanted connection may for example be a connection between a battery having a first voltage and a component having a second voltage different from the first voltage, whereby the battery may be drained or damaged and/or the component may be damaged.

An audio device is disclosed. The audio device comprises a housing and an electronic circuit accommodated in the housing. The electronic circuit comprises a circuit board and one or more components including a first component mounted on the circuit board. The electronic circuit comprises a first shielding layer, a first insulation layer, and a second insulation layer, e.g., covering the first component. The second insulation layer is arranged between the first insulation layer and the first shielding layer.

The audio device may be a hearing device such as a hearable or a hearing aid, comprising a processor configured to compensate for a hearing loss of a user. The audio device may be of the behind-the-ear (BTE) type, in-the-ear (ITE) type, in-the-canal (ITC) type, receiver-in-canal (RIC) type or receiver-in-the-ear (RITE) type. The hearing aid may be a binaural hearing aid. The first insulation layer and/or the first protection layer may insulate and protect the electronic circuit and in turn the audio device from the environment that the audio device is exposed to. For example, when the audio device is worn by a user the audio device may be exposed to sweat and cerumen from the user and weather conditions such as humidity, heat, and dust, which may be desirable to be insulated and protected from.

An electronic circuit for an audio device is disclosed. The electronic circuit comprises a circuit board and one or more components including a first component mounted on the circuit board. The electronic circuit comprises a first shielding layer, a first insulation layer and optionally a second insulation layer, the second insulation layer being arranged between the first insulation layer and the first shielding layer. The first insulation layer may at least partly be arranged between the circuit board and the first component.

In one or more exemplary electronic circuits, the first shielding layer has a thickness in the range from 50 µm to 150 µm, such as in the range from 75 µm to 125 µm. Optionally, the first shielding layer has a thickness in the range from 1 µm to 150 µm. The first shielding layer may have a thickness less than 50 µm.

In one or more exemplary methods/electronic circuits/audio devices, the one or more components comprises a second component. The method may comprise applying the first insulation layer on the second component.

In one or more exemplary electronic circuits/audio devices, the one or more components comprise a second component mounted on the circuit board. The first insulation layer and/or the first shielding layer may cover the second component.

In one or more exemplary electronic circuits/audio devices, the electronic circuit comprises a first protection layer outside the first shielding layer. The first protection layer may fully or at least partially cover the first shielding layer. In one or more exemplary electronic circuits/audio devices, the circuit board comprises a ground connection contacting the first shielding layer. In one or more exemplary electronic circuits/audio devices, the first shielding layer, or at least a first portion and/or a second portion of the first shielding layer, is insulated from the ground connection of the circuit board.

In one or more exemplary electronic circuits, the first insulation layer may substantially cover the circuit board combined with the first shielding layer covering the components and the first protection layer covering the first shielding layer.

It is to be understood that a description of a feature in relation to method(s) is also applicable to the corresponding feature in electronic circuit/audio device.

Examples of methods and products (electronic circuit and audio device) according to the disclosure are set out in the following items:

Item 1. Method of manufacturing an electronic circuit of an audio device, the method comprising:
providing a body comprising a circuit board and one or more components including a first component mounted on the circuit board;
applying a first insulation layer;
applying a second insulation layer; and
applying one or more shielding layers including a first shielding layer covering at least a part of the second insulation layer,
wherein applying the first insulation layer comprises jetting the first insulation layer and curing the first insulation layer, and applying the second insulation layer comprises jetting the second insulation layer and curing the second insulation layer.

Item 2. Method according to item 1, wherein jetting the first insulation layer comprises applying one or more droplets of first insulation material, the droplets having a volume in the range from 0.01 μL to 0.1 μL.

Item 3. Method according to any of items 1-2, wherein jetting the first insulation layer comprises jetting one or more first areas including a first primary area of the body.

Item 4. Method according to any of items 1-3, wherein jetting the second insulation layer comprises jetting one or more second areas including a second primary area of the body.

Item 5. Method according to item 4 as dependent on item 3, wherein the first primary area and the second primary area is partly overlapping.

Item 6. Method according to any of items 1-5, wherein curing the first insulation layer comprises UV-curing the first insulation layer.

Item 7. Method according to any of items 1-6, wherein curing the second insulation layer comprises UV-curing the second insulation layer to form a first interface between the first insulation layer and the second insulation layer.

Item 8. Method according to any of items 1-7, wherein the first insulation layer is made of a first insulation material comprising one or more polymers.

Item 9. Method according to item 8, wherein the first material has a first viscosity prior to curing of in the range from 0.30 to 200 Pa·s.

Item 10. Method according to any of items 1-9, wherein the body comprises a plurality of circuit boards and one or more components including a first component mounted on each of the circuit boards, and wherein applying a first insulation layer comprises applying a first insulation layer to each of the circuit boards before applying the second insulation layer.

Item 11. Method according to item 10, wherein applying a second insulation layer comprises applying a second insulation layer to each of the circuit boards before applying the first shielding layer.

Item 12. Audio device comprising a housing and an electronic circuit accommodated in the housing, the electronic circuit comprising a circuit board and one or more components including a first component mounted on the circuit board, the electronic circuit comprising a first shielding layer, a first insulation layer and a second insulation layer, the second insulation layer being arranged between the first insulation layer and the first shielding layer.

Item 13. Electronic circuit for an audio device, the electronic circuit comprising a circuit board and one or more components including a first component mounted on the circuit board, the electronic circuit comprising a first shielding layer, a first insulation layer and a second insulation layer, the second insulation layer being arranged between the first insulation layer and the first shielding layer.

Item 14. Electronic circuit according to item 13, wherein the first shielding layer has a thickness in the range from 50 μm to 150 μm.

FIG. 1 shows a first or distal view of parts of an exemplary body comprising a circuit board. The electronic circuit 6, 6A, 6B, 6C comprises a circuit board 8 and one or more components including a first component 10 having a first area A_C_1. The first component 10 is mounted on the circuit board 8 at a first position P_C_1. The first component 10 may be a power supply module. The electronic circuit 6 optionally comprises a second component 12 having a second area A_C_2. The second component 12 is mounted on the circuit board 8 at a second position P_C_2. The electronic circuit 6 optionally comprises a third component 14 having a third area A_C_3. The third component 14 is mounted on the circuit board 8 at a third position P_C_3. The third component 14 may be an antenna. The circuit board 8 comprises a ground connection 15, the ground connection 15 comprising one or more ground pad elements 15A exposed on the circuit board. The ground pad elements 15A are connected to a common ground of the circuit board 8. In one or more exemplary methods and/or electronic circuits, the ground pad elements 15A form a ground pad ring around one or more components, such as encircling one or more components on the circuit board. In other words, the ground pad elements 15A optionally form a ground pad ring or ground pad ring structure encircling the first component 10 and/or the second component 12. The ground pad elements 15A optionally form a ground pad ring or ground pad ring structure encircling the third component 14.

Figure 2:
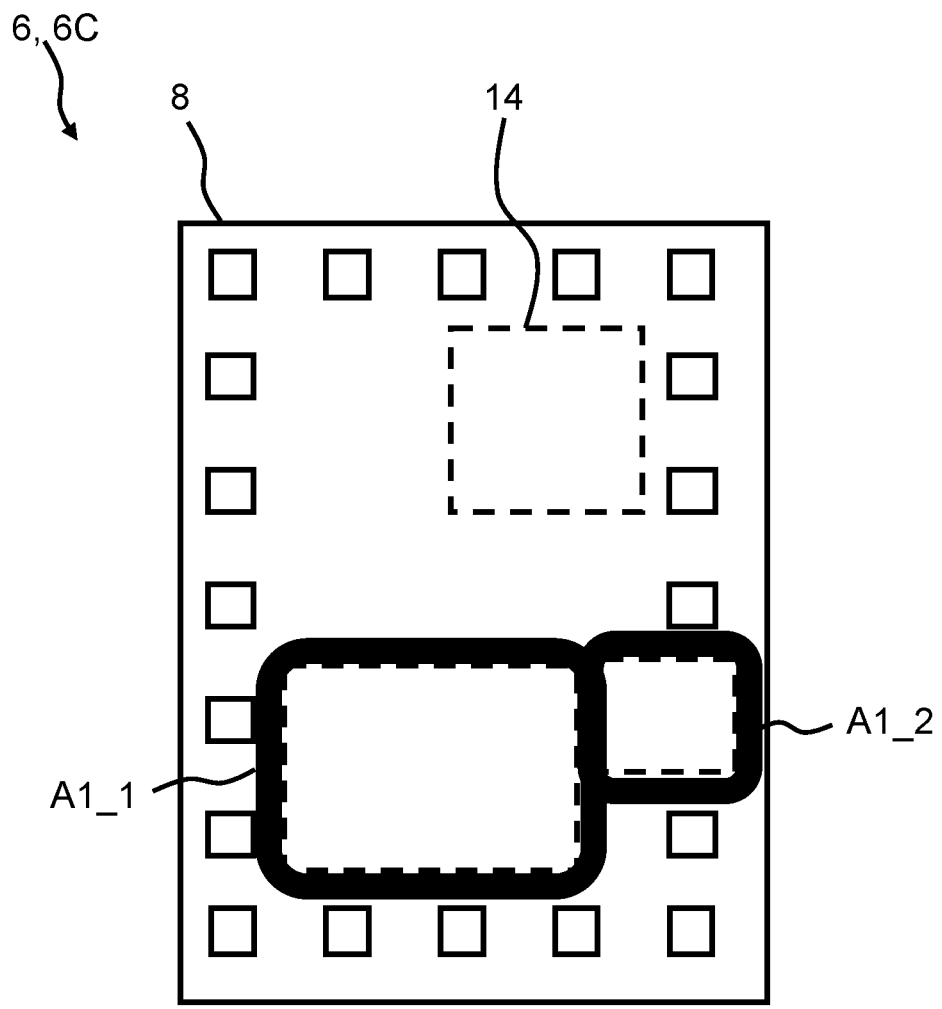

FIG. 2 shows a first view or distal view of parts of exemplary electronic circuits. The electronic circuit 6, 6C comprises a first insulation layer 16 covering a first primary area A1_1 of the body (e.g. around the first component 10) and optionally a first secondary area A1_2 of the body (e.g. around the second component 12). As may be seen in FIG. 2 the first primary area A1_1 and the first secondary area A1_2 overlaps.

Figure 3:
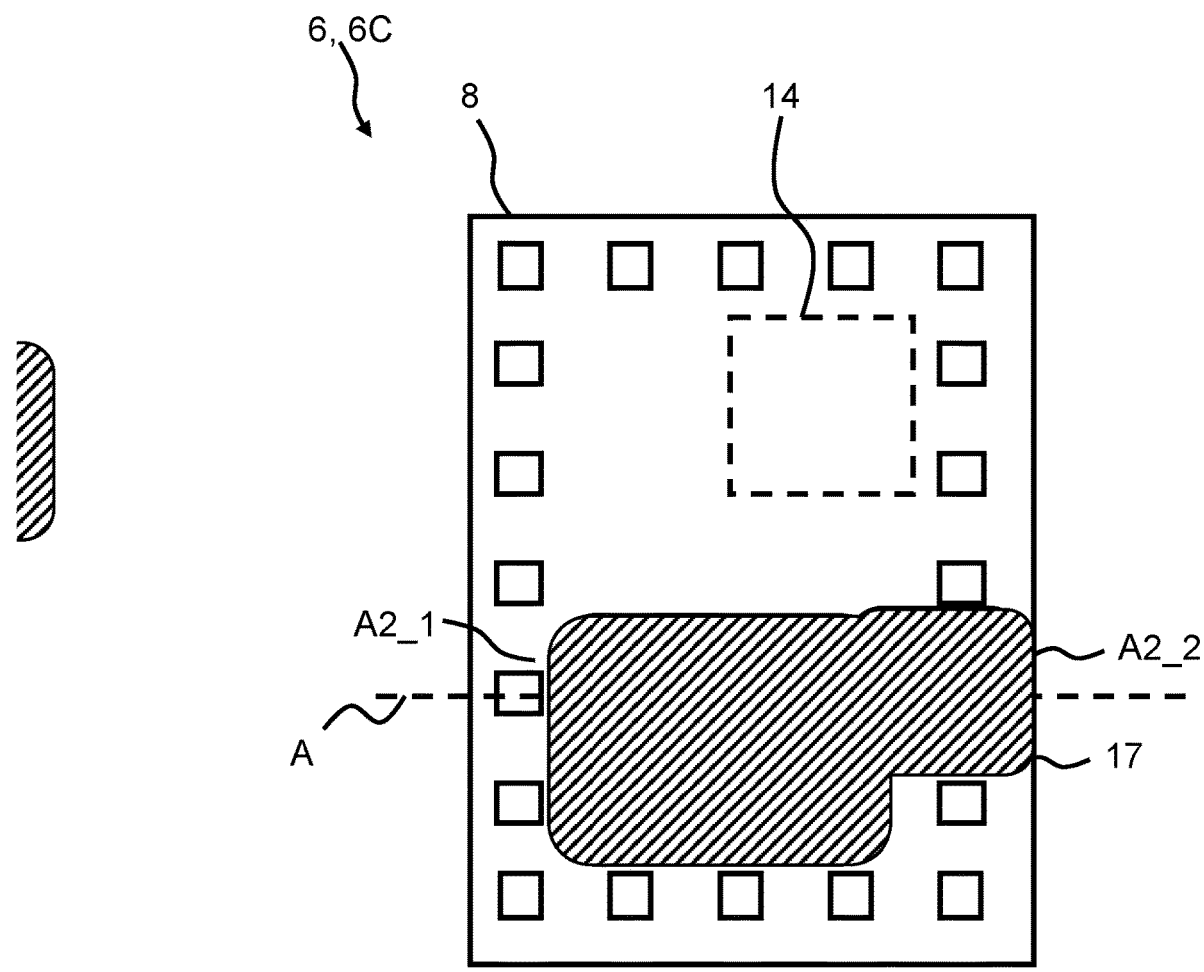

FIG. 3 shows a first view or distal view of parts of exemplary electronic circuits. The electronic circuit 6, 6C comprises a second insulation layer 17 covering a second primary area A2_1 of the body (e.g., covering the first component 10) and optionally a second secondary area A2_2 of the body (e.g., covering the second component 12). As may be seen in FIG. 3 the second primary area A2_1 and the second secondary area A2_2 overlaps.

Figure 4:
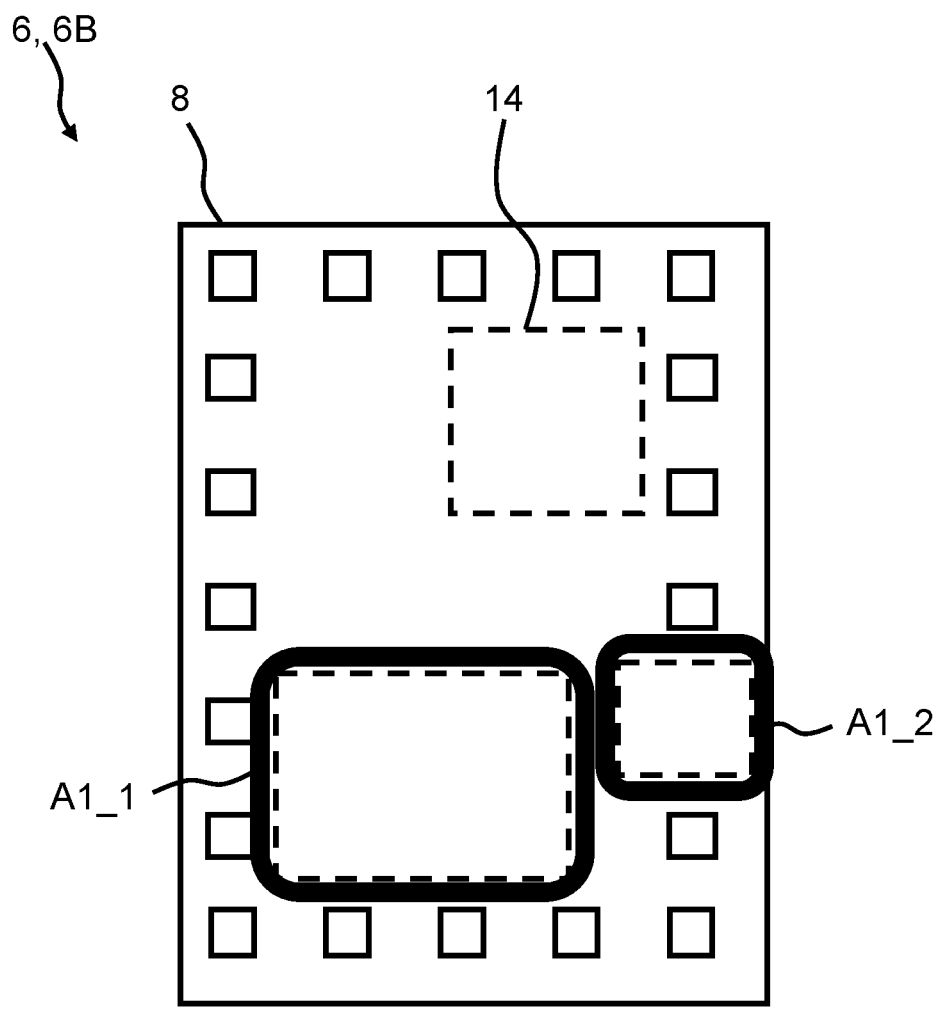

FIG. 4 shows a first view or distal view of parts of exemplary electronic circuits. The electronic circuit 6, 6C comprises a first insulation layer 16 covering a first primary area A1_1 of the body (e.g., around the first component 10) and optionally a first secondary area A1_2 of the body (e.g., around the second component 12). As may be seen in FIG. 4 the first primary area A1_1 and the first secondary area A1_2 are separated and do not overlap.

Figure 5:
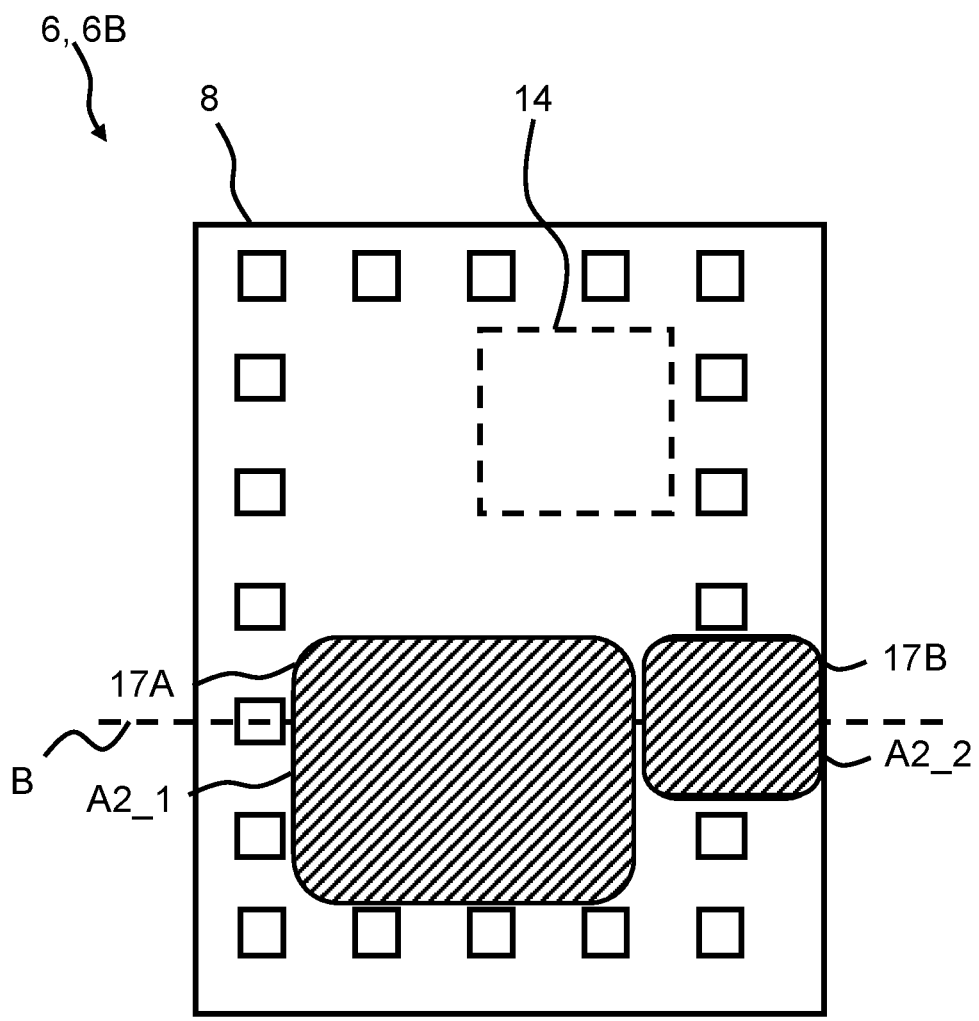

FIG. 5 shows a first view or distal view of parts of exemplary electronic circuits. The electronic circuit 6, 6C comprises a second insulation layer 17 covering a second primary area A2_1 of the body (e.g., covering the first component 10) and optionally a second secondary area A2_2 of the body (e.g., covering the second component 12). As may be seen in FIG. 5 the second primary area A2_1 and the second secondary area A2_2 are separated and do not overlap.

Figure 6:
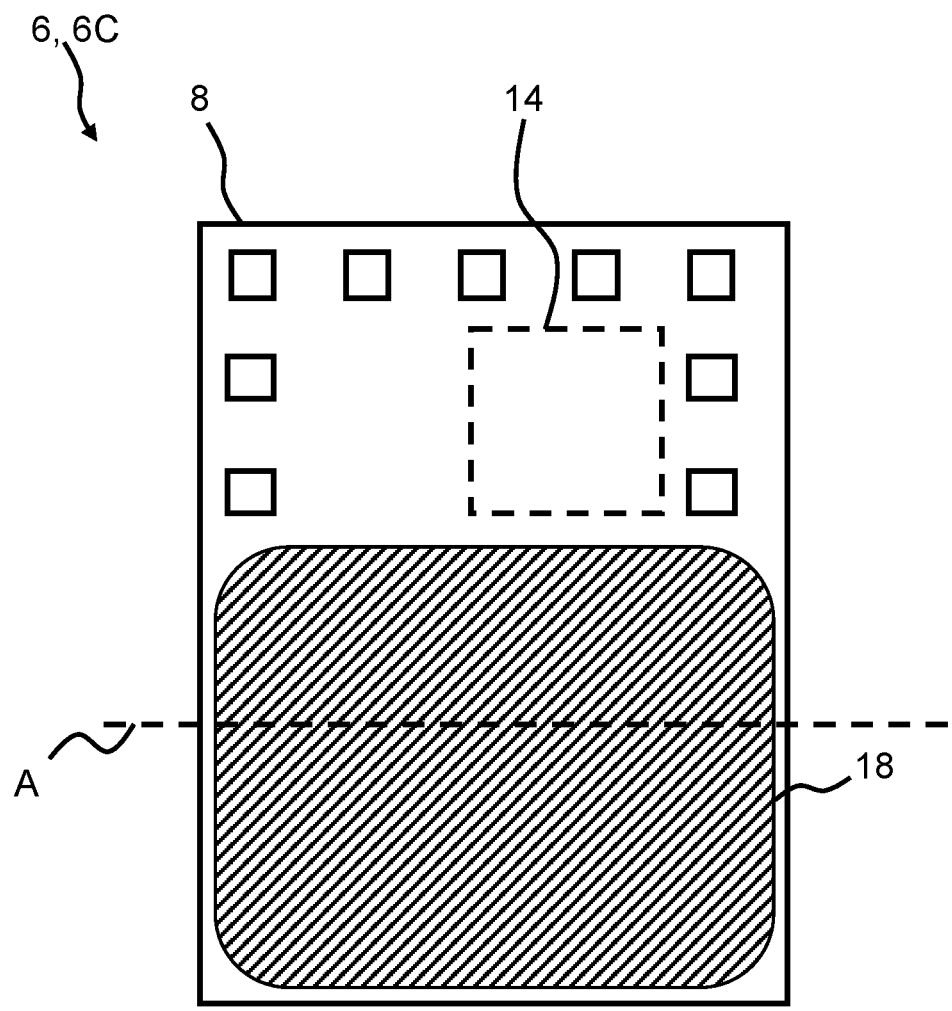

FIG. 6 shows a first view or distal view of parts of exemplary electronic circuits. The electronic circuit 6, 6C comprises a first shielding layer 18 outside and covering the first insulation layer 16, 16A, 16B, the second insulation layer 17, 17A, 17B see FIGS. 2-5. The first shielding layer 18 covers and shields the first component 10 (first area A_C_1) and optionally the second component 12 (second area A_C_2). Further, the first shielding layer 18 is in electrical (galvanic) contact with the ground connection 15 via one or more ground pad elements. The first shielding layer 18 may have first electromagnetic properties in the first area of the first component 10 and may be configured to shield a first electromagnetic interference of the first component 10, e.g. to shield in a first frequency range such as in a frequency range used by another component of the electronic circuit. The first shielding layer 18 may have second electromagnetic properties in the second area of the second component 12 and may be configured to shield a second electromagnetic interference of the second component 12, e.g. to shield in a second frequency range such as in a frequency range used by another component of the electronic circuit.

Figure 7:
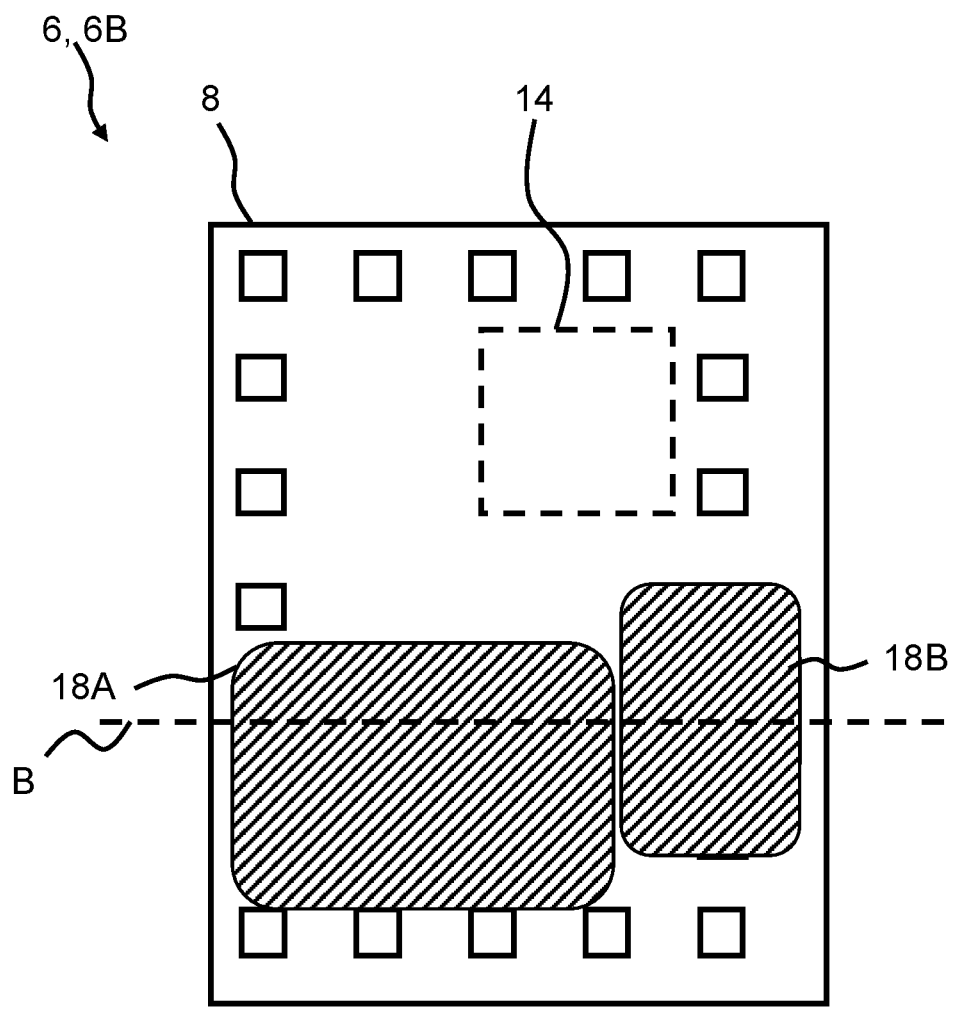

FIG. 7 shows a first view or distal view of parts of exemplary electronic circuits. The electronic circuit 6B shown in FIG. 7 is similar to the electronic circuit 6C shown in FIG. 6, but the first portion 16A of the first insulation layer, the first portion 17A of the second insulation layer, and the first portion 18A of the first shielding layer are separated from the second portion 16B of the first insulation layer, the second portion 17B of the second insulation layer, and the second portion 18B of the first shielding layer.

The first insulation layer (not visible in FIG. 7) is separated into at least a first portion 16A and a second portion 16B, e.g., to provide increased design flexibility when designing the electronic circuit. Accordingly, the electronic circuit 6A, 6B comprises a first portion 16A of first insulation layer and a second portion 16B of first insulation layer.

The second insulation layer (not visible in FIG. 7) is separated into at least a first portion 17A and a second portion 17B, e.g. to provide increased design flexibility when designing the electronic circuit. Accordingly, the electronic circuit 6A, 6B comprises a first portion 17A of second insulation layer and a second portion 17B of second insulation layer. The first portion 17A of second insulation layer is outside and covering the first component 10. The second portion 17B of second insulation layer is outside and covering the second component 12.

The first shielding layer is separated into at least a first portion 18A and a second portion 18B, e.g., to provide increased design flexibility when designing the electronic circuit. Accordingly, the electronic circuit 6B comprises a first portion 18A of first shielding layer outside and covering the first portion 16A of the first insulation layer and the first portion 17A of the second insulation layer. The first portion 18A of the first shielding layer covers and shields the first component 10. Further, the electronic circuit 6B optionally comprises a second portion 18B of first shielding layer outside and covering the second portion 16B of the first insulation layer and the second portion 17B of the second insulation layer. The second portion 18B of the first shielding layer covers and shields the second component 12. The first portion 18A of the first shielding layer and the second portion 18B of the first shielding layer may have the same of different properties, such as thickness and/or shielding material. The first portion 18A may have first electromagnetic properties configured to shield a first electromagnetic interference of the first component, e.g., to shield in a first frequency range such as in a frequency range used by another component of the electronic circuit. The second portion 18A may have second electromagnetic properties configured to shield a second electromagnetic interference of the second component, e.g., to shield in a second frequency range such as in a frequency range used by another component of the electronic circuit. The first portion 18A and/or the second portion may contact one or more ground pad elements of the circuit board, respectively. In one or more exemplary electronic circuits, the first portion of the first shielding layer may be insulated from the ground connection of the circuit board. In one or more exemplary electronic circuits, the second portion of the first shielding layer may be insulated from the ground connection of the circuit board.

Figure 8:
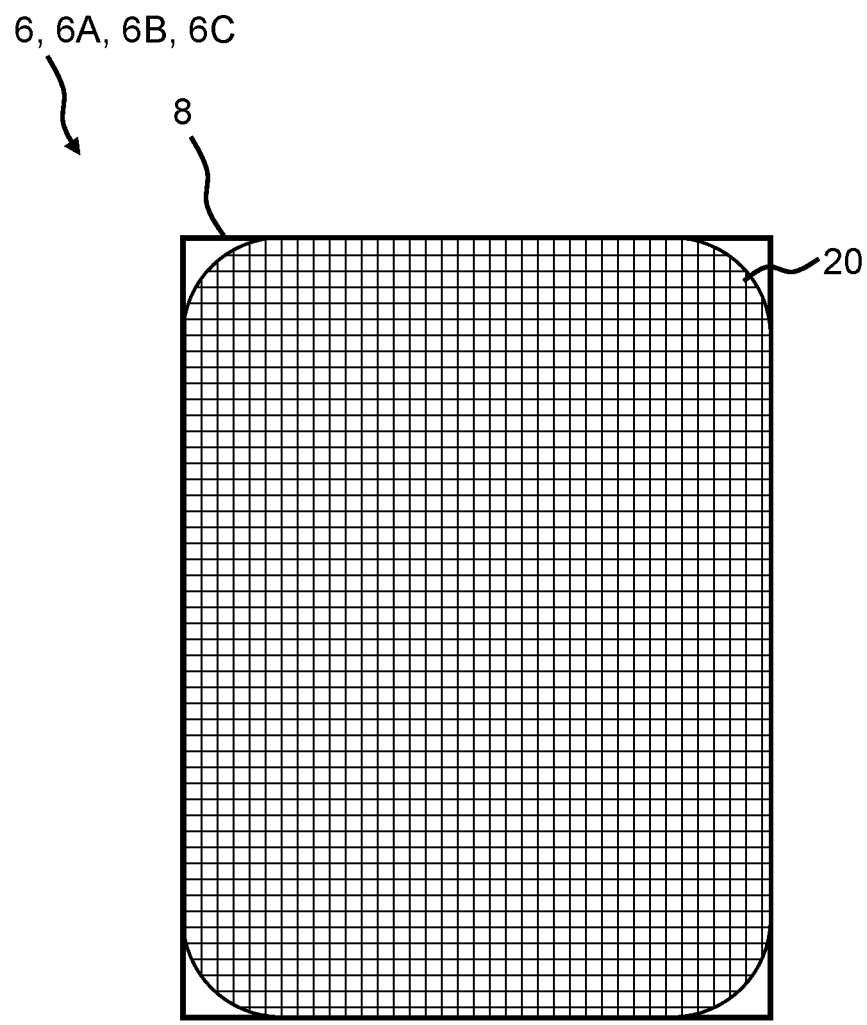

FIG. 8 shows a first or distal view of parts of exemplary electronic circuits. The electronic circuit 6, 6A, 6B, 6C optionally comprises a first protection layer 20 outside and covering the first shielding layer 18, 18A, 18B.

Figure 9A:
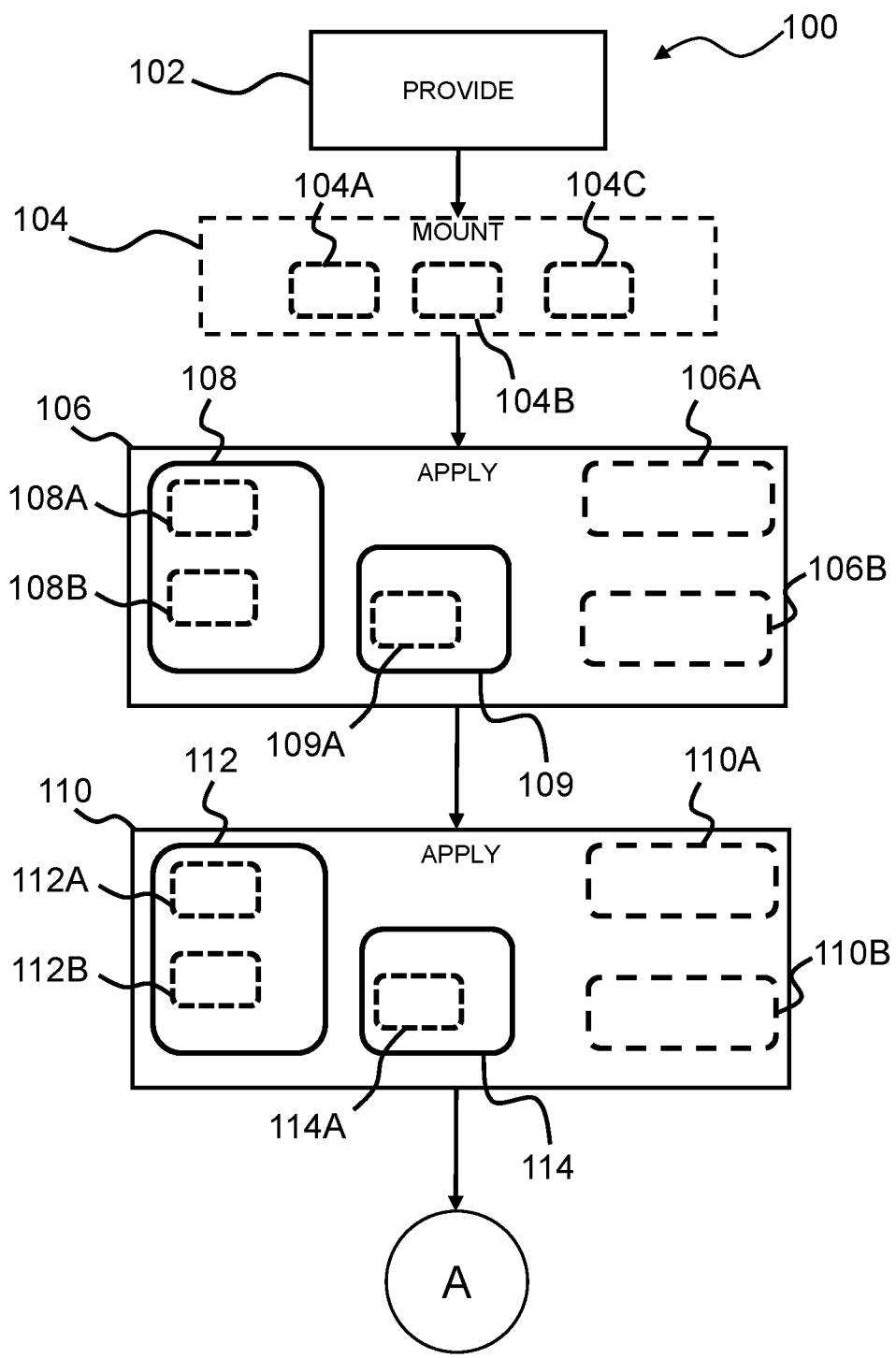
FIGS. 9A-B is a flow chart of an exemplary method according to the disclosure.
Figure 9B:
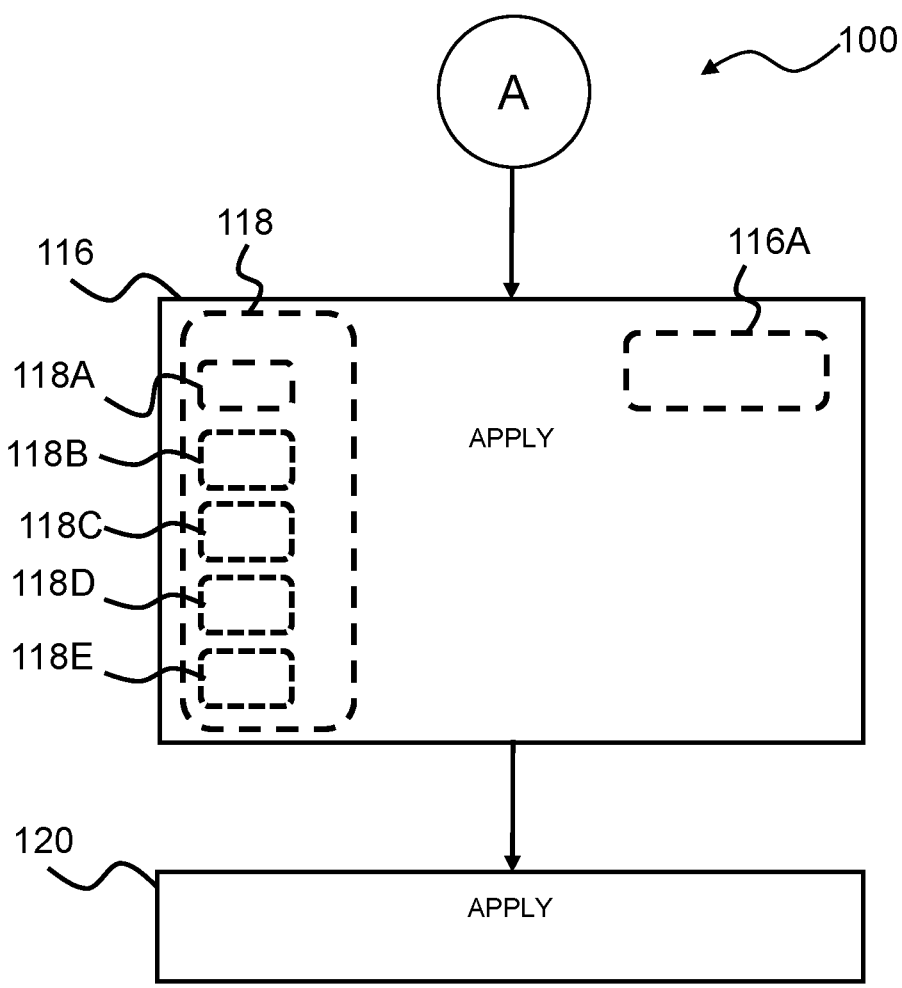

FIGS. 9A-B is a flow diagram of an exemplary method. The method 100 of manufacturing an electronic circuit of an audio device comprises providing 102 a body comprising a circuit board and one or more components including a first component. Optionally, the method 100 comprises mounting 104 one or more components including mounting 104A the first component on the circuit board. Mounting 104 one or more components may comprise mounting 104B a second component on the circuit board, and/or mounting 104C a third component on the circuit board. The method 100 comprises applying 106 a first insulation layer; applying 110 a second insulation layer, and applying 116 one or more shielding layers including a first shielding layer covering at least part of the second insulation layer. In method 100, applying 106 a first insulation layer comprises jetting 108 the first insulation layer. In method 100, applying 106 a first insulation layer optionally comprises applying 106A a masking before jetting 108 the first insulation layer. In method 100, applying 106 a first insulation layer comprises curing 109 the first insulation layer.

In the method 100, jetting 108 the first insulation layer comprises applying 108A one or more droplets of first insulation material, the droplets having a volume in the range from 0.01 µL to 0.1 µL.

In the method 100, jetting 108 the first insulation layer comprises jetting 108B one or more first areas including a first primary area of the body.

In the method 100, curing 109 the first insulation layer comprises UV-curing 109A the first insulation layer.

In the method 100, the body comprises a plurality of circuit boards and one or more components including a first component mounted on each of the circuit boards, and applying 106 a first insulation layer comprises applying 106B a first insulation layer to each of the circuit boards before applying 110 the second insulation layer.

In method 100, applying 110 a second insulation layer comprises jetting 112 the second insulation layer. In method 100, applying 110 a second insulation layer optionally comprises applying 110A a masking before jetting 112 the second insulation layer. In method 100, applying 110 the second insulation layer comprises curing 114 the second insulation layer.

In the method 100, jetting 112 the second insulation layer comprises applying 112A one or more droplets of second insulation material, the droplets having a volume in the range from 0.01 µL to 0.1 µL.

In the method 100, jetting 112 the second insulation layer comprises jetting 112B one or more second areas including a second primary area of the body.

In the method 100, curing 114 the second insulation layer comprises UV-curing 114A the second insulation layer to form a first interface between the first insulation layer and the second insulation layer.

In the method 100, applying 110 a second insulation layer comprises applying 110B a second insulation layer to each of the circuit boards before applying 116 the first shielding layer.

In the method 100, applying 116 a first shielding layer optionally comprises applying 118 a first shielding layer outside, e.g. on a distal side of, the second insulation layer. Applying 116 a first shielding layer optionally comprises contacting 118A the first shielding layer to a ground connection, e.g. as part of applying 118 a first shielding layer outside, e.g. on a distal side of, the first insulation layer.

Applying 118 the first shielding layer outside the second insulation layer may comprise one or more of moulding 118B first shielding material on the second insulation layer, spraying 118C first shielding material on the second insulation layer, and jetting 118D first shielding material on the second insulation layer, e.g. as part of optionally covering the second insulation layer with first shielding material. In method 100, applying 118 a first shielding layer outside the second insulation layer optionally comprises applying 118E a masking optionally before jetting 118D and/or spraying 118C the first shielding material. In method 100, applying 116 a first shielding layer optionally comprises curing 116A the first shielding layer.

The method 100 optionally comprises applying 120 a first protection layer outside the first shielding layer.

Figure 10:
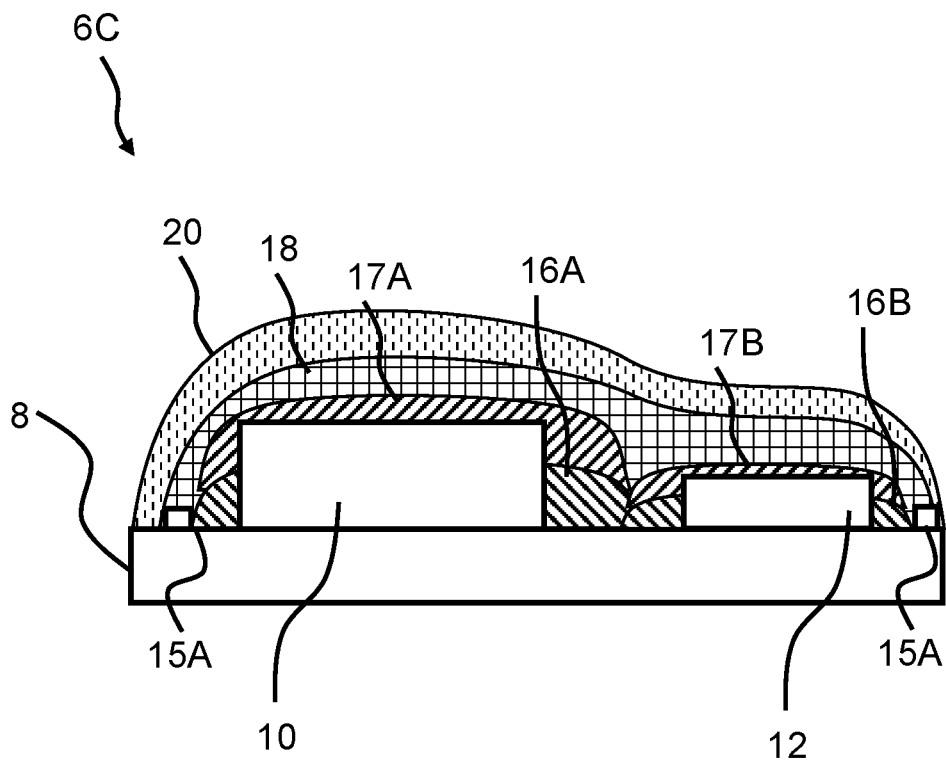
FIG. 10 shows a cross section of exemplary electronic circuits according to the disclosure.

FIG. 10 shows a cross-sectional view along a cross section line A of electronic circuit 6C. The first portion 16A of the first insulation layer covers a first primary area A1_1 of the body and surrounds the first component 10. The first portion of the first insulation layer has a first thickness T_FIL_1 (not shown) in the range from 1 µm to 500 µm. The second portion 16B of the first insulation layer covers a first secondary area A1_2 of the body and surrounds the second component 12. The second portion of the first insulation layer has a second thickness T_FIL_2 (not shown) in the range from 1 µm to 500 µm.

The first portion 17A of the second insulation layer covers a second primary area A2_1 of the body and covers the first component 10. The first portion 17A of the second insulation layer has a first thickness T_SIL_1 in the range from 10 µm to 500 µm. The second portion 17B of the second insulation layer covers a second secondary area A2_2 of the body and covers the second component 12. The second portion 17B of the second insulation layer has a second thickness T_SIL_2 (not shown) in the range from 10 µm to 500 µm. As may be seen on FIG. 9, the first primary area A1_1 and the second primary area A2_1 are partly overlapping. The first secondary area A1_2 and the second secondary area A2_2 are also partly overlapping.

The first shielding layer 18 may comprise metallic particles and contacts ground pad element 15A. The first shielding layer 18 covers the first portion 16A and the second portion 16B of the first insulation layer 16, and the first portion 17A and the second portion 17B of the second insulation layer 17 and therefore also the first component 10 and the second component 12. The first shielding layer has a first thickness T_FSL_1 in the range from 1 µm to 500 µm and a second thickness T_FSL_2 (maximum thickness in the second area of the second component) in the range from 1 µm to 500 µm. The first thickness T_FSL_1 is different from the second thickness T_FSL_2 and configured to shield a first electromagnetic field from the first component 10. The second thickness T_FSL_2 is configured to shield a second electromagnetic field from the second component 12.

Figure 11:
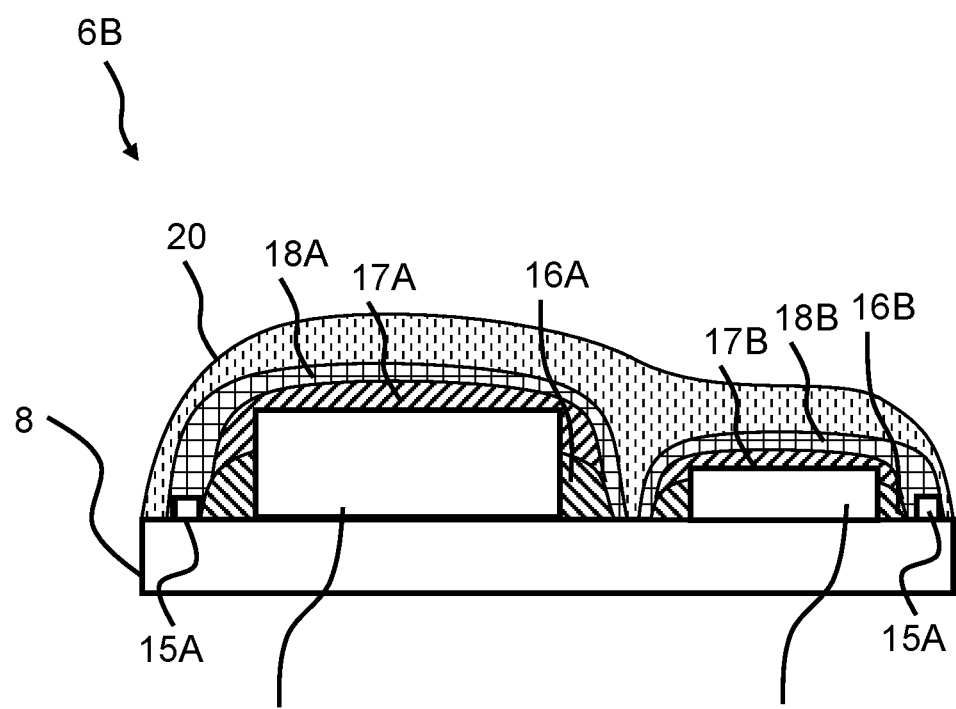
FIG. 11 shows a cross section of exemplary electronic circuits according to the disclosure.

FIG. 11 shows a cross-sectional view along a cross section line B of electronic circuit 6B. The electronic circuit 6B shown in FIG. 11 is similar to the electronic circuit 6C shown in FIG. 10, but the first portion 16A of the first insulation layer, the first portion 17A of the second insulation layer, and the first portion 18A of the first shielding layer are separated from the second portion 16B of the first insulation layer, the second portion 17B of the second insulation layer, and the second portion 18B of the first shielding layer.

Figure 12:
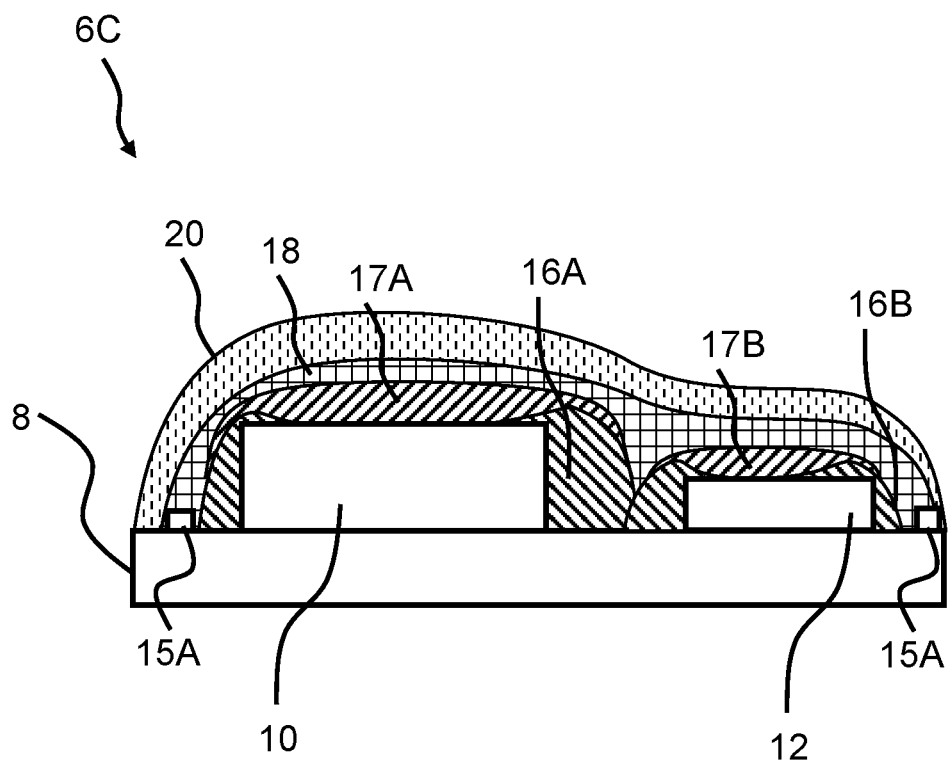
FIG. 12 shows a cross section of exemplary electronic circuits according to the disclosure.

FIG. 12 shows a cross-sectional view along the cross section line A of electronic circuit 6C. The electronic circuit 6C shown in FIG. 12 is similar to the electronic circuit 6C shown in FIG. 10, but the first portion 16A of the first insulation layer 16 has a larger first thickness T_FIL_1 and the second portion 16B of the first insulation layer 16 has a larger second thickness T_FIL_2 than in FIG. 10. As may be seen in FIG. 12, the first insulation layer 16 covers at least partly the edges/corners of the first component 10 and the second component 12.

As may be seen in FIG. 12, the first portion 17A of the second insulation layer 17 covers a central part of the first component 10, and the second portion 17B of the second insulation layer 17 covers a central part of the second component 12. The combination of the first insulation layer 16 and the second insulation layer 17 provides an insulation of the first component 10 and the second component 12. By having the first insulation layer 16 on the edges of the first component 10 and the second component 12 the first insulation layer may promote the adhesion of the second insulation 17 to the edges/corners of the first component 10 and/or the second component 12. The first insulation layer 16 and the second insulation layer 12 may thereby build up at the edges/corners of the first component 10 and the second component 12 in order to insulate them efficiently.

Figure 13:
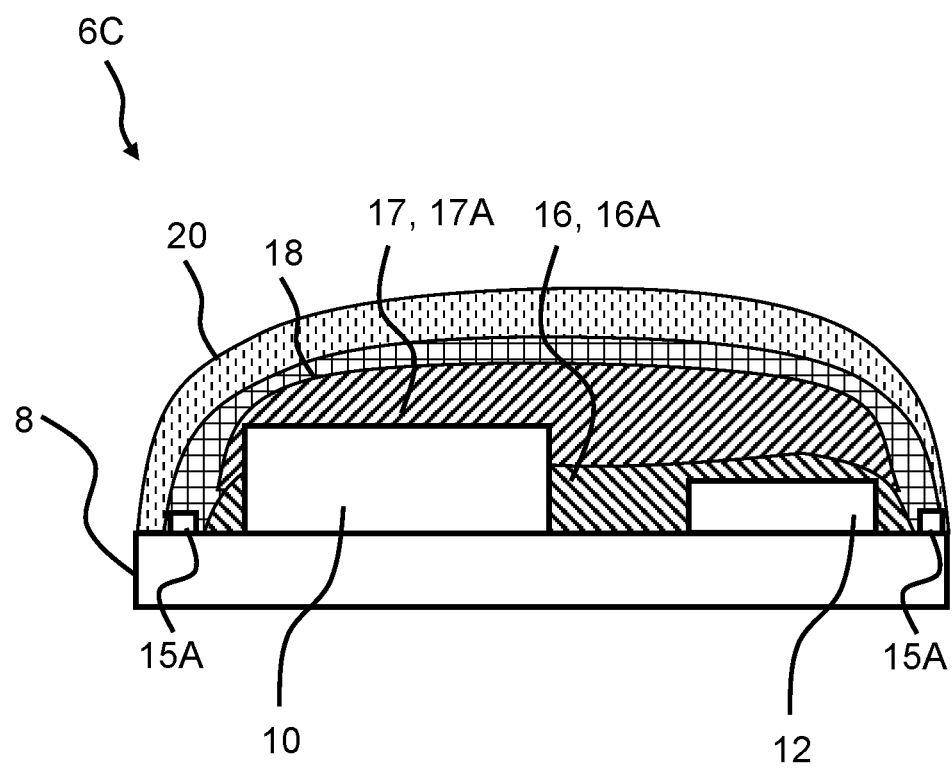
FIG. 13 shows a cross section of exemplary electronic circuits according to the disclosure.

FIG. 13 shows a cross-sectional view along the cross section line A of electronic circuit 6C. The electronic circuit 6C shown in FIG. 13 is similar to the electronic circuit 6C shown in FIG. 10, but the first insulation layer 16 only comprises a first portion 16A with a first thickness T_FIL_1 covering at least partly the first component 10 and the second component 12. In other words, the first insulation layer 16 is applied as one continuous first portion 16A or layer on both the first component 10 and the second component 12.

As may be seen in FIG. 13, the second insulation layer 17 only comprises a first portion 17A with a first thickness T_SIL_1 covering the first component 10 and the second component 12. In other words, the second insulation layer 17 is applied as one continuous first portion 17A or layer on both the first component 10 and the second component 12.

Figure 14:
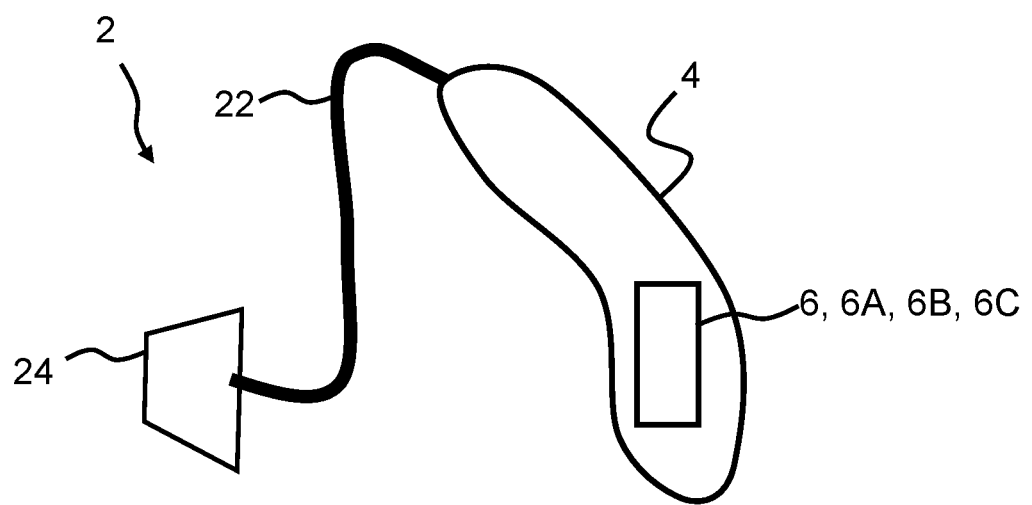
FIG. 14 shows an exemplary audio device.

FIG. 14 shows an exemplary audio device 2. The audio device 2 comprises a housing 4 and an electronic circuit 6 accommodated in the housing 4. The housing 4 being connected to an ear part 24 by a tubular member 22. The ear part 24 is configured to be positioned in an ear of a user of the audio device 2. The housing 4 is configured to be positioned behind the ear of a user. The tubular member 22 is configured to connect the housing 4 and thereby the electronic circuit 6 to the ear part 24 e.g. by being positioned above or beneath the ear of the user.

The first insulation layer 16, the second insulation layer 17, the first shielding layer 18, and/or the first protection layer 20 may insulate and protect the electronic circuit 6 and in turn the audio device 2 from the environment that the audio device 2 is exposed to. For example, when the audio device 2 is worn by a user the audio device 2 may be exposed e.g. to sweat and cerumen from the user and weather conditions such as humidity, heat, and dust, which may be desirable to be insulated and protected from.

In other exemplary audio devices (not shown) such as an in-the-ear (ITE) type or in-the-canal (ITC), the housing 4 may be an ear part 24, such that the housing 4 and the ear part 24 are in one piece positioned in the ear of the user. The ear part 24 may thereby be the audio device 2.

The use of the terms "first", "second", "third" and "fourth", "primary", "secondary", "tertiary" etc. does not imply any particular order, but are included to identify individual elements. Moreover, the use of the terms "first", "second", "third" and "fourth", "primary", "secondary", "tertiary" etc. does not denote any order or importance, but rather the terms "first", "second", "third" and "fourth", "primary", "secondary", "tertiary" etc. are used to distinguish one element from another. Note that the words "first", "second", "third" and "fourth", "primary", "secondary", "tertiary" etc. are used here and elsewhere for labelling purposes only and are not intended to denote any specific spatial or temporal ordering.

Furthermore, the labelling of a first element does not imply the presence of a second element and vice versa.

It may be appreciated that FIGS. 1-14 comprise some modules or operations which are illustrated with a solid line and some modules or operations which are illustrated with a dashed line. The modules or operations which are comprised in a solid line are modules or operations which are comprised in the broadest example embodiment. The modules or operations which are comprised in a dashed line are example embodiments which may be comprised in, or a part of, or are further modules or operations which may be taken in addition to the modules or operations of the solid line example embodiments. It should be appreciated that these operations need not be performed in order presented. Furthermore, it should be appreciated that not all of the operations need to be performed. The exemplary operations may be performed in any order and in any combination.

It is to be noted that the word "comprising" does not necessarily exclude the presence of other elements or steps than those listed.

It is to be noted that the words "a" or "an" preceding an element do not exclude the presence of a plurality of such elements.

It should further be noted that any reference signs do not limit the scope of the claims, that the exemplary embodiments may be implemented at least in part by means of both hardware and software, and that several "means", "units" or "devices" may be represented by the same item of hardware.

The various exemplary methods, devices, and systems described herein are described in the general context of method steps processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform specified tasks or implement specific abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

LIST OF REFERENCES 2 audio device
4 housing
6, 6A, 6B, 6C electronic circuit
8 circuit board
10 first component, power supply circuitry
12 second component
14 third component
15 ground connection
15A ground pad element
16 first insulation layer
16A first portion of first insulation layer
16B second portion of first insulation layer
17 second insulation layer
17A first portion of second insulation layer
17B second portion of second insulation layer
18 first shielding layer
18A first portion of first shielding layer
18B second portion of first shielding layer
20 first protection layer
22 tubular member
24 ear part
100 method of manufacturing an electronic circuit of an audio device
102 providing a body
104 mounting one or more components on the circuit board
104A mounting a first component on the circuit board 104B mounting a second component on the circuit board
104C mounting a third component on the circuit board
106 applying a first insulation layer
106A applying a masking
106B applying a first insulation layer to each of the circuit boards
108 jetting the first insulation layer
108A applying one or more droplets of first insulation material
108B jetting one or more first areas including a first primary area of the body
109 curing the first insulation layer
109A UV-curing the first insulation layer
110 applying a second insulation layer
110A applying a masking
110B applying a second insulation layer to each of the circuit boards
112 jetting the second insulation layer
112A applying one or more droplets of second insulation material
112B jetting one or more second areas including a second primary area of the body
114 curing the second insulation layer
114A UV-curing the second insulation layer
116 applying a first shielding layer
116A curing the first shielding layer
118 applying a first shielding layer outside the first insulation layer
118A contacting the first shielding layer to a ground connection
118B moulding first shielding material on the first insulation layer
118C spraying first shielding material on the first insulation layer
118D jetting first shielding material on the first insulation layer
118E applying a masking
120 applying a first protection layer outside the first shielding layer
A cross section line
B cross section line
A1_1 first primary area of first insulation layer
A1_2 first secondary area of first insulation layer
A2_1 second primary area of second insulation layer
A2_2 second secondary area of second insulation layer
A_C_1 first area of first component
A_C_2 second area of second component
A_C_3 third area of third component
P_C_1 first position of first component
P_C_2 second position of second component
P_C_3 third position of third component
T_FIL_1 first thickness of the first insulation layer
T_FIL_2 second thickness of the first insulation layer
T_SIL_1 first thickness of the second insulation layer
T_SIL_2 second thickness of the second insulation layer
T_FSL_1 first thickness of the first shielding layer
T_FSL_2 second thickness of the first shielding layer

The invention claimed is:

1. A method of manufacturing an electronic circuit of an audio device, the method comprising:
providing a body, the body comprising a circuit board and one or more components including a first component mounted on the circuit board;
applying a first insulation layer;
applying a second insulation layer; and
applying one or more shielding layers including a first shielding layer covering at least a part of the second insulation layer;
wherein the first shielding layer comprises a periphery part that is applied to surround at least a lower part of one of the one or more components, wherein the periphery part of the first shielding layer is applied after the first insulation layer and the second insulation layer are applied.

2. The method of claim 1, wherein the act of jetting the first material of the first insulation layer comprises applying a droplet of the first material, the droplet having a volume that is anywhere from 0.01 µL to 0.1 µL.

3. The method of claim 1, wherein the first material of the first insulation layer is jetted towards one or more first areas including a first primary area of the body.

4. The method of claim 3, wherein the second material of the second insulation layer is jetted towards one or more second areas including a second primary area of the body.

5. The method of claim 4, wherein the first primary area and the second primary area are partly overlapping.

6. The method of claim 1, wherein a material of the first insulation layer has a first viscosity that is anywhere from 0.30 to 200 Pa·s before the material is cured.

7. The method of claim 1, wherein the act of applying the first insulation layer comprises jetting a first material of the first insulation layer and curing the first material of the first insulation layer, and wherein the act of applying the second insulation layer comprises jetting a second material of the second insulation layer and curing the second material of the second insulation layer.

8. An electronic circuit for an audio device, the electronic circuit comprising:
a circuit board; and
one or more components including a first component mounted on the circuit board;
a first shielding layer;
a first insulation layer; and
a second insulation layer, the second insulation layer being between the first insulation layer and the first shielding layer;
wherein the circuit board comprises a first surface and a second surface opposite from the first surface, wherein the circuit board comprises a ground pad element located closer to the first surface of the circuit board than to the second surface of the circuit board, and wherein the first shielding layer is in contact with the ground pad element that is closer to the first surface of the circuit board than to the second surface of the circuit board.

9. The electronic circuit of claim 8, wherein the first shielding layer has a thickness that is anywhere from 50 µm to 150 µm.

10. The electronic circuit of claim 8, wherein the first component comprises a ground connection.

11. The electronic circuit of claim 8, wherein a material of the first insulation layer has a first state before curing, and a second state after curing.

12. The electronic circuit of claim 11, wherein when the material is in the first state, the material has a first viscosity that is anywhere from 0.30 to 200 Pa·s.

13. The electronic circuit of claim 8, wherein a material composition of the first insulation layer and a material composition of the second insulation layer are the same.

14. A method of manufacturing an electronic circuit of an audio device, the method comprising:

providing a body, the body comprising a circuit board and one or more components including a first component mounted on the circuit board;
applying a first insulation layer;
applying a second insulation layer; and
applying one or more shielding layers including a first shielding layer covering at least a part of the second insulation layer;
wherein the circuit board comprises a first surface and a second surface opposite from the first surface, wherein the circuit board comprises a ground pad element located closer to the first surface of the circuit board than to the second surface of the circuit board, and wherein the first shielding layer is applied to contact the ground pad element that is located closer to the first surface of the circuit board than to the second surface of the circuit board.

15. The method of claim 14, wherein the act of applying the first insulation layer comprises jetting a first material of the first insulation layer, and curing the first material of the first insulation layer, and wherein the first material, before cured, has a first viscosity that is anywhere from 0.30 to 200 Pa·s.

16. The method of claim 14, wherein the act of applying the first insulation layer comprises applying droplets of a first material of the first insulation layer, and wherein one of the droplets of the first material has a volume that is anywhere from 0.01 μL to 0.1 μL.

17. A method of manufacturing an electronic circuit of an audio device, the method comprising:
providing a body, the body comprising a circuit board and one or more components including a first component mounted on the circuit board;
applying a first insulation layer so that the first insulation layer is in contact with the first component;
applying a second insulation layer so that the second insulation layer is in contact with the first component; and
applying one or more shielding layers including a first shielding layer above at least a part of the second insulation layer;
wherein a material composition of the first insulation layer and a material composition of the second insulation layer are the same.

18. The method of claim 17, wherein the act of applying the first insulation layer comprises jetting a first material of the first insulation layer, and curing the first material of the first insulation layer, and wherein the first material, before cured, has a first viscosity that is anywhere from 0.30 to 200 Pa·s.

19. The method of claim 17, wherein the act of applying the first insulation layer comprises applying droplets of a first material of the first insulation layer, and wherein one of the droplets of the first material has a volume that is anywhere from 0.01 μL to 0.1 μL.

20. An audio device comprising the electronic circuit of claim 8, and a housing containing the electronic circuit.

21. An electronic circuit for an audio device, the electronic circuit comprising:
a circuit board; and
one or more components including a first component mounted on the circuit board;
a first shielding layer;
a first insulation layer in contact with the first component; and
a second insulation layer in contact with the first component, at least a part of the second insulation layer being between the first insulation layer and the first shielding layer;
wherein a material composition of the first insulation layer and a material composition of the second insulation layer are the same.

22. An audio device comprising the electronic circuit of claim 21, and a housing containing the electronic circuit.

23. An electronic circuit for an audio device, the electronic circuit comprising:
a circuit board; and
one or more components including a first component mounted on the circuit board;
a first shielding layer;
a first insulation layer; and
a second insulation layer, the second insulation layer being between the first insulation layer and the first shielding layer;
wherein the first insulation layer and the second insulation layer are electrically non-conductive; and
wherein the first shielding layer has a bottom part in contact with the circuit board or with a pad on the circuit board, wherein the first shielding layer has a top part that is above the first component, and wherein the bottom part and the top part of the first shielding layer have an unity configuration.

24. The electronic circuit of claim 23, wherein the first insulation layer is in contact with a side of the first component, and the second insulation layer is in contact with a top of the first component.

25. The electronic circuit of claim 23, wherein the first shielding layer has a thickness that is anywhere from 50 μm to 150 μm.

26. The electronic circuit of claim 23, wherein a material of the first insulation layer has a first viscosity that is anywhere from 0.30 to 200 Pa·s before the material is cured.

27. The electronic circuit of claim 23, wherein a material composition of the first insulation layer and a material composition of the second insulation layer are the same.

28. An audio device comprising the electronic circuit of claim 23, and a housing containing the electronic circuit.

* * * * *